(12) United States Patent
Anderson

(10) Patent No.: US 8,078,970 B1
(45) Date of Patent: Dec. 13, 2011

(54) GRAPHICAL USER INTERFACE WITH USER-SELECTABLE LIST-BOX

(75) Inventor: Doug Anderson, Edmund, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 658 days.

(21) Appl. No.: 10/008,096

(22) Filed: Nov. 9, 2001

(51) Int. Cl.
- G06F 15/177 (2006.01)
- G06F 3/48 (2006.01)
- G06F 17/50 (2006.01)
- G01R 31/28 (2006.01)

(52) U.S. Cl. ........ 715/735; 715/808; 715/763; 716/100; 714/724

(58) Field of Classification Search .................. 345/808, 345/809, 810; 717/104, 105; 716/1; 706/919; 714/724; 715/964, 734, 735, 763, 808, 809; 700/90

See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |

(Continued)

FOREIGN PATENT DOCUMENTS

DE 19710829 A1 9/1998

(Continued)

OTHER PUBLICATIONS

Microsoft Windows 98, Copyright 1998.*

(Continued)

*Primary Examiner* — Ting Lee

(57) ABSTRACT

A graphical user interface for configuring a programmable integrated circuit is disclosed. More specifically, the graphical user interface may comprise a displayed graphical representation of the programmable integrated circuit, where the graphical representation includes one or more selectable portions which may represent actual circuitry or components of the programmable integrated circuit. A user-selectable list box may be displayed which comprises one or more selectable items for configuring a selected portion of the graphical representation of the programmable integrated circuit. The user-selectable list box may be displayed in response to a selection of a selectable portion of the programmable integrated circuit for configuration. Additionally, the user-selectable list box may disappear or no longer be displayed in response to a user interaction outside the user-selectable list box, in response to a selection of an item from the user-selectable list box, etc.

21 Claims, 5 Drawing Sheets

U.S. PATENT DOCUMENTS

| | | |
|---|---|---|
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,757,534 A | 7/1988 | Matyas et al. |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 6,590,517 B1 | 7/1993 | Swanson |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |

| | | | | | | |
|---|---|---|---|---|---|---|
| 5,426,384 A | 6/1995 | May | | 5,625,316 A | 4/1997 | Chambers et al. |
| 5,428,319 A | 6/1995 | Marvin et al. | | 5,625,583 A | 4/1997 | Hyatt |
| 5,430,395 A | 7/1995 | Ichimaru | | 5,629,857 A | 5/1997 | Brennan |
| 5,430,687 A | 7/1995 | Hung et al. | | 5,629,891 A | 5/1997 | LeMoncheck et al. |
| 5,430,734 A | 7/1995 | Gilson | | 5,630,052 A | 5/1997 | Shah |
| 5,432,476 A | 7/1995 | Tran | | 5,630,057 A | 5/1997 | Hait |
| 5,438,672 A | 8/1995 | Dey | | 5,630,102 A | 5/1997 | Johnson et al. |
| 5,440,305 A | 8/1995 | Signore et al. | | 5,631,577 A | 5/1997 | Freidin et al. |
| 5,451,887 A | 9/1995 | El-Avat et al. | | 5,633,766 A | 5/1997 | Hase et al. |
| 5,453,904 A | 9/1995 | Higashiyama et al. | | 5,642,295 A | 6/1997 | Smayling |
| 5,455,525 A | 10/1995 | Ho et al. | | 5,646,544 A | 7/1997 | Iadanza |
| 5,455,731 A | 10/1995 | Parkinson | | 5,646,901 A | 7/1997 | Sharpe-Geisler et al. |
| 5,455,927 A | 10/1995 | Huang | | 5,648,642 A | 7/1997 | Miller et al. |
| 5,457,410 A | 10/1995 | Ting | | 5,651,035 A | 7/1997 | Tozun |
| 5,457,479 A | 10/1995 | Cheng | | 5,652,893 A | 7/1997 | Ben-Meir et al. |
| 5,463,591 A | 10/1995 | Aimoto et al. | | 5,661,433 A | 8/1997 | LaRosa et al. |
| 5,479,603 A | 12/1995 | Stone et al. | | 5,663,900 A | 9/1997 | Bhandari et al. |
| 5,479,643 A | 12/1995 | Bhaskar et al. | | 5,663,965 A | 9/1997 | Seymour |
| 5,479,652 A | 12/1995 | Dreyer et al. | | 5,664,199 A | 9/1997 | Kuwahara |
| 5,481,471 A | 1/1996 | Naglestad | | 5,666,480 A | 9/1997 | Leung et al. |
| 5,488,204 A | 1/1996 | Mead et al. | | 5,670,915 A | 9/1997 | Cooper et al. |
| 5,491,458 A | 2/1996 | McCune | | 5,673,198 A | 9/1997 | Lawman et al. |
| 5,493,246 A | 2/1996 | Anderson | | 5,675,825 A | 10/1997 | Dreyer et al. |
| 5,493,723 A | 2/1996 | Beck et al. | | 5,677,691 A | 10/1997 | Hosticka et al. |
| 5,495,077 A | 2/1996 | Miller et al. | | 5,680,070 A | 10/1997 | Anderson et al. |
| 5,495,593 A | 2/1996 | Elmer et al. | | 5,682,032 A | 10/1997 | Philipp |
| 5,495,594 A | 2/1996 | MacKenna et al. | | 5,684,434 A | 11/1997 | Mann et al. |
| 5,497,119 A | 3/1996 | Tedrow et al. | | 5,684,952 A | 11/1997 | Stein |
| 5,499,192 A | 3/1996 | Knapp et al. | | 5,686,844 A | 11/1997 | Hull et al. |
| 5,500,823 A | 3/1996 | Martin et al. | | 5,687,325 A | 11/1997 | Chang |
| 5,513,119 A * | 4/1996 | Moore et al. ............. 716/8 | | 5,689,195 A | 11/1997 | Cliff et al. |
| 5,517,198 A | 5/1996 | McEwan | | 5,689,196 A | 11/1997 | Schutte |
| 5,519,854 A | 5/1996 | Watt | | 5,691,664 A | 11/1997 | Anderson et al. |
| 5,521,529 A | 5/1996 | Agrawal et al. | | 5,691,898 A | 11/1997 | Rosenberg et al. |
| 5,530,444 A | 6/1996 | Tice et al. | | 5,694,063 A | 12/1997 | Burlison et al. |
| 5,530,673 A | 6/1996 | Tobita et al. | | 5,696,952 A | 12/1997 | Pontarelli |
| 5,530,813 A | 6/1996 | Paulsen et al. | | 5,699,024 A | 12/1997 | Manlove et al. |
| 5,537,057 A | 7/1996 | Leong et al. | | 5,703,871 A | 12/1997 | Pope et al. |
| 5,541,878 A | 7/1996 | LeMoncheck et al. | | 5,706,453 A * | 1/1998 | Cheng et al. ............. 345/809 |
| 5,542,055 A | 7/1996 | Amini et al. | | 5,708,589 A | 1/1998 | Beauvais |
| 5,543,588 A | 8/1996 | Bisset et al. | | 5,708,798 A | 1/1998 | Lynch et al. |
| 5,543,590 A | 8/1996 | Gillespie et al. | | 5,710,906 A | 1/1998 | Ghosh et al. |
| 5,543,591 A | 8/1996 | Gillespie et al. | | 5,712,969 A | 1/1998 | Zimmermann et al. |
| 5,544,067 A | 8/1996 | Rostoker et al. | | 5,721,931 A | 2/1998 | Gephardt et al. |
| 5,544,311 A | 8/1996 | Harenberg et al. | | 5,724,009 A | 3/1998 | Collins et al. |
| 5,546,433 A | 8/1996 | Tran et al. | | 5,727,170 A | 3/1998 | Mitchell et al. |
| 5,546,562 A | 8/1996 | Patel | | 5,728,933 A | 3/1998 | Schultz et al. |
| 6,338,109 B1 | 8/1996 | Snyder et al. | | 5,729,704 A | 3/1998 | Stone et al. |
| 5,552,725 A | 9/1996 | Ray et al. | | 5,730,165 A | 3/1998 | Philipp |
| 5,552,748 A | 9/1996 | O'Shaughnessy | | 5,732,277 A | 3/1998 | Kodosky et al. |
| 5,554,951 A | 9/1996 | Gough | | 5,734,272 A | 3/1998 | Belot et al. |
| 5,555,452 A | 9/1996 | Callaway et al. | | 5,734,334 A | 3/1998 | Hsieh et al. |
| 5,555,907 A | 9/1996 | Philipp | | 5,737,557 A * | 4/1998 | Sullivan ............. 345/765 |
| 5,557,762 A | 9/1996 | Okuaki et al. | | 5,737,760 A | 4/1998 | Grimmer et al. |
| 5,559,502 A | 9/1996 | Schutte | | 5,745,011 A | 4/1998 | Scott |
| 5,559,996 A | 9/1996 | Fujioka et al. | | 5,748,048 A | 5/1998 | Moyal |
| 5,563,526 A | 10/1996 | Hastings et al. | | 5,748,875 A | 5/1998 | Tzori |
| 5,563,529 A | 10/1996 | Seltzer et al. | | 5,752,013 A | 5/1998 | Christensen et al. |
| 5,564,010 A | 10/1996 | Henry et al. | | 5,754,552 A | 5/1998 | Allmond et al. |
| 5,564,108 A | 10/1996 | Hunsaker et al. | | 5,754,826 A | 5/1998 | Gamal et al. |
| 5,565,658 A | 10/1996 | Gerpheide et al. | | 5,757,368 A | 5/1998 | Gerpheide et al. |
| 5,566,702 A | 10/1996 | Philipp | | 5,758,058 A | 5/1998 | Milburn |
| 5,572,665 A | 11/1996 | Nakabayashi et al. | | 5,761,128 A | 6/1998 | Watanabe |
| 5,572,719 A | 11/1996 | Blesterfeldt | | 5,763,909 A | 6/1998 | Mead et al. |
| 5,574,678 A | 11/1996 | Gorecki | | 5,764,714 A | 6/1998 | Stansell et al. |
| 5,574,852 A | 11/1996 | Bakker et al. | | 5,767,457 A | 6/1998 | Gerpheide et al. |
| 5,574,892 A | 11/1996 | Christensen | | 5,774,704 A | 6/1998 | Williams |
| 5,579,353 A | 11/1996 | Parmenter et al. | | 5,777,399 A | 7/1998 | Shibuya |
| 5,587,945 A | 12/1996 | Lin et al. | | 5,781,030 A | 7/1998 | Agrawal et al. |
| 5,587,957 A | 12/1996 | Kowalczyk et al. | | 5,781,747 A | 7/1998 | Kametani |
| 5,590,354 A | 12/1996 | Klapproth et al. | | 5,784,545 A | 7/1998 | Anderson et al. |
| 5,594,388 A | 1/1997 | O'Shaughnessy et al. | | 5,790,957 A | 8/1998 | Heidari |
| 5,594,734 A | 1/1997 | Worsley et al. | | 5,796,183 A | 8/1998 | Hourmand |
| 5,594,876 A | 1/1997 | Getzlaff et al. | | 5,799,176 A | 8/1998 | Kapusta et al. |
| 5,594,890 A | 1/1997 | Yamaura et al. | | 5,801,958 A | 9/1998 | Dangelo et al. |
| 5,600,262 A | 2/1997 | Kolze | | 5,802,073 A | 9/1998 | Platt |
| 5,604,466 A | 2/1997 | Dreps et al. | | 5,802,290 A | 9/1998 | Casselman |
| 5,608,892 A | 3/1997 | Wakerly | | 5,805,792 A | 9/1998 | Swoboda et al. |
| 5,614,861 A | 3/1997 | Harada | | 5,805,897 A | 9/1998 | Glowny |

| | | | | | | |
|---|---|---|---|---|---|---|
| 5,808,883 A | 9/1998 | Hawkes | | 5,949,632 A | 9/1999 | Barreras, Sr. et al. |
| 5,811,987 A | 9/1998 | Ashmore, Jr. et al. | | 5,952,888 A | 9/1999 | Scott |
| 5,812,698 A | 9/1998 | Platt et al. | | 5,956,279 A | 9/1999 | Mo et al. |
| 5,818,254 A | 10/1998 | Agrawal et al. | | 5,959,871 A | 9/1999 | Pierzchala et al. |
| 5,818,444 A | 10/1998 | Alimpich et al. | | 5,963,075 A | 10/1999 | Hiiragizawa |
| 5,818,736 A | 10/1998 | Leibold | | 5,963,105 A | 10/1999 | Nguyen |
| 5,819,028 A | 10/1998 | Manghirmalani et al. | | 5,963,503 A | 10/1999 | Lee |
| 5,822,387 A | 10/1998 | Mar | | 5,964,893 A | 10/1999 | Circello et al. |
| 5,822,531 A | 10/1998 | Gorczyca et al. | | 5,966,027 A | 10/1999 | Kapusta et al. |
| 5,828,693 A | 10/1998 | Mays et al. | | 5,966,532 A * | 10/1999 | McDonald et al. ........... 717/105 |
| 5,838,583 A | 11/1998 | Varadarajan et al. | | 5,968,135 A | 10/1999 | Teramoto et al. |
| 5,841,078 A | 11/1998 | Miller et al. | | 5,969,513 A | 10/1999 | Clark |
| 5,841,996 A | 11/1998 | Nolan et al. | | 5,969,632 A | 10/1999 | Diamant et al. |
| 5,844,256 A | 12/1998 | Mead et al. | | 5,973,368 A | 10/1999 | Pearce et al. |
| 5,844,404 A | 12/1998 | Caser et al. | | 5,974,235 A | 10/1999 | Nunally et al. |
| 5,848,285 A | 12/1998 | Kapusta et al. | | 5,977,791 A | 11/1999 | Veenstra |
| 5,850,156 A | 12/1998 | Wittman | | 5,978,584 A | 11/1999 | Nishibata et al. |
| 5,852,733 A | 12/1998 | Chien et al. | | 5,978,937 A | 11/1999 | Miyamori et al. |
| 5,854,625 A | 12/1998 | Frisch et al. | | 5,982,105 A | 11/1999 | Masters |
| 5,857,109 A | 1/1999 | Taylor | | 5,982,229 A | 11/1999 | Wong et al. |
| 5,861,583 A | 1/1999 | Schediwy et al. | | 5,982,241 A | 11/1999 | Nguyen et al. |
| 5,861,875 A | 1/1999 | Gerpheide | | 5,983,277 A | 11/1999 | Heile et al. |
| 5,864,242 A | 1/1999 | Allen et al. | | 5,986,479 A | 11/1999 | Mohan |
| 5,864,392 A | 1/1999 | Winklhofer et al. | | 5,987,246 A | 11/1999 | Thomsen et al. |
| 5,867,046 A | 2/1999 | Sugasawa | | 5,988,902 A | 11/1999 | Holehan |
| 5,867,399 A | 2/1999 | Rostoker et al. | | 5,994,939 A | 11/1999 | Johnson et al. |
| 5,869,979 A | 2/1999 | Bocchino | | 5,996,032 A | 11/1999 | Baker |
| 5,870,004 A | 2/1999 | Lu | | 5,999,725 A | 12/1999 | Barbier et al. |
| 5,870,309 A | 2/1999 | Lawman | | 6,002,268 A | 12/1999 | Sasaki et al. |
| 5,870,345 A | 2/1999 | Stecker | | 6,002,398 A | 12/1999 | Wilson |
| 5,872,464 A | 2/1999 | Gradinariu | | 6,003,054 A | 12/1999 | Oshima et al. |
| 5,874,958 A | 2/1999 | Ludolph | | 6,003,107 A | 12/1999 | Ranson et al. |
| 5,875,293 A | 2/1999 | Bell et al. | | 6,003,133 A | 12/1999 | Moughanni et al. |
| 5,877,656 A | 3/1999 | Mann et al. | | 6,005,814 A | 12/1999 | Mulholland et al. |
| 5,878,425 A | 3/1999 | Redpath | | 6,005,904 A | 12/1999 | Knapp et al. |
| 5,880,411 A | 3/1999 | Gillespie et al. | | 6,008,685 A | 12/1999 | Kunst |
| 5,880,598 A | 3/1999 | Duong | | 6,008,703 A | 12/1999 | Perrott et al. |
| 5,883,623 A | 3/1999 | Cseri | | 6,009,270 A | 12/1999 | Mann |
| 5,886,582 A | 3/1999 | Stansell | | 6,009,496 A | 12/1999 | Tsai |
| 5,887,189 A | 3/1999 | Birns et al. | | 6,011,407 A | 1/2000 | New |
| 5,889,236 A | 3/1999 | Gillespie et al. | | 6,012,835 A | 1/2000 | Thompson et al. |
| 5,889,723 A | 3/1999 | Pascucci | | 6,014,135 A | 1/2000 | Fernandes |
| 5,889,936 A | 3/1999 | Chan | | 6,014,509 A | 1/2000 | Furtek et al. |
| 5,889,988 A | 3/1999 | Held | | 6,014,723 A | 1/2000 | Tremblay et al. |
| 5,894,226 A | 4/1999 | Koyama | | 6,016,554 A | 1/2000 | Skrovan et al. |
| 5,894,243 A | 4/1999 | Hwang | | 6,016,563 A | 1/2000 | Fleisher |
| 5,894,565 A | 4/1999 | Furtek et al. | | 6,018,559 A | 1/2000 | Azegami et al. |
| 5,895,494 A | 4/1999 | Scalzi et al. | | 6,023,422 A | 2/2000 | Allen et al. |
| 5,896,068 A | 4/1999 | Moyal | | 6,023,565 A * | 2/2000 | Lawman et al. .................. 716/1 |
| 5,896,330 A | 4/1999 | Gibson | | 6,026,134 A | 2/2000 | Duffy et al. |
| 5,898,345 A | 4/1999 | Namura et al. | | 6,026,501 A | 2/2000 | Hohl et al. |
| 5,900,780 A | 5/1999 | Hirose et al. | | 6,028,271 A | 2/2000 | Gillespie et al. |
| 5,901,062 A | 5/1999 | Burch et al. | | 6,028,959 A | 2/2000 | Wang et al. |
| 5,903,718 A | 5/1999 | Marik | | 6,031,365 A | 2/2000 | Sharpe-Geisler |
| 5,905,398 A | 5/1999 | Todsen et al. | | 6,032,268 A | 2/2000 | Swoboda et al. |
| 5,909,544 A | 6/1999 | Anderson, II et al. | | 6,034,538 A | 3/2000 | Abramovici |
| 5,911,059 A | 6/1999 | Profit, Jr. | | 6,035,320 A | 3/2000 | Kiriaki et al. |
| 5,914,465 A | 6/1999 | Allen et al. | | 6,037,807 A | 3/2000 | Wu et al. |
| 5,914,633 A | 6/1999 | Comino et al. | | 6,038,551 A | 3/2000 | Barlow et al. |
| 5,914,708 A | 6/1999 | LaGrange et al. | | 6,041,406 A | 3/2000 | Mann |
| 5,917,356 A | 6/1999 | Casal et al. | | 6,043,695 A | 3/2000 | O'Sullivan |
| 5,920,310 A | 7/1999 | Faggin et al. | | 6,043,719 A | 3/2000 | Lin et al. |
| 5,923,264 A | 7/1999 | Lavelle et al. | | 6,049,223 A | 4/2000 | Lytle et al. |
| 5,926,566 A | 7/1999 | Wang et al. | | 6,049,225 A | 4/2000 | Huang et al. |
| 5,929,710 A | 7/1999 | Bien | | 6,051,772 A | 4/2000 | Cameron et al. |
| 5,930,148 A | 7/1999 | Bjorksten et al. | | 6,052,035 A | 4/2000 | Nolan et al. |
| 5,930,150 A | 7/1999 | Cohen et al. | | 6,052,524 A | 4/2000 | Pauna |
| 5,931,959 A | 8/1999 | Kwiat | | 6,055,584 A | 4/2000 | Bridges et al. |
| 5,933,023 A | 8/1999 | Young | | 6,057,705 A | 5/2000 | Wojewoda et al. |
| 5,933,356 A | 8/1999 | Rostoker et al. | | 6,058,263 A | 5/2000 | Voth |
| 5,933,816 A | 8/1999 | Zeanah et al. | | 6,058,452 A | 5/2000 | Rangasayee et al. |
| 5,935,233 A | 8/1999 | Jeddeloh | | 6,061,511 A | 5/2000 | Marantz et al. |
| 5,935,266 A | 8/1999 | Thurnhofer et al. | | 6,066,961 A | 5/2000 | Lee et al. |
| 5,939,904 A | 8/1999 | Fetterman et al. | | 6,070,003 A | 5/2000 | Gove et al. |
| 5,939,949 A | 8/1999 | Olgaard et al. | | 6,072,803 A | 6/2000 | Allmond et al. |
| 5,941,991 A | 8/1999 | Kageshima | | 6,075,941 A | 6/2000 | Itoh et al. |
| 5,942,733 A | 8/1999 | Allen et al. | | 6,079,985 A | 6/2000 | Wohl et al. |
| 5,943,052 A | 8/1999 | Allen et al. | | 6,081,140 A | 6/2000 | King |
| 5,945,878 A | 8/1999 | Westwick et al. | | 6,094,730 A | 7/2000 | Lopez et al. |

| | | | |
|---|---|---|---|
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir |
| 6,167,364 A | 12/2000 | Stellenberg et al. |
| 6,167,559 A | 12/2000 | Furtek et al. |
| 6,169,383 B1 | 1/2001 | Sabin et al. |
| 6,172,428 B1 | 1/2001 | Jordan |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | van der Wal et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Kemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,253,754 B1 | 7/2001 | Roohparvar |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | McClintock et al. |
| 6,272,646 B1 | 8/2001 | Rangasayee |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,302,268 B1 | 10/2001 | Swoboda et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 7,406,674 B1 | 10/2001 | Ogami et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei |
| 6,371,878 B1 | 4/2002 | Bowen |
| 6,373,954 B1 | 4/2002 | Malcolm et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |

| Patent | Type | Date | Inventor(s) |
|---|---|---|---|
| 6,380,929 | B1 | 4/2002 | Platt |
| 6,380,931 | B1 | 4/2002 | Gillespie et al. |
| 6,384,947 | B1 | 5/2002 | Ackerman et al. |
| 6,385,742 | B1 | 5/2002 | Kirsch et al. |
| 6,388,109 | B1 | 5/2002 | Schwarz et al. |
| 6,388,464 | B1 | 5/2002 | Lacey et al. |
| 6,396,302 | B2 | 5/2002 | New et al. |
| 6,396,657 | B1 | 5/2002 | Suzuki |
| 6,397,232 | B1 | 5/2002 | Cheng-Hung et al. |
| 6,401,230 | B1 | 6/2002 | Ahanessians et al. |
| 6,404,204 | B1 | 6/2002 | Farruggia et al. |
| 6,404,445 | B1 | 6/2002 | Galea et al. |
| 6,407,953 | B1 | 6/2002 | Cleeves |
| 6,408,432 | B1 | 6/2002 | Herrmann et al. |
| 6,411,665 | B1 | 6/2002 | Chan et al. |
| 6,411,974 | B1 | 6/2002 | Graham et al. |
| 6,414,671 | B1 | 7/2002 | Gillespie et al. |
| 6,421,698 | B1 | 7/2002 | Hong |
| 6,421,817 | B1 | 7/2002 | Mohan et al. |
| 6,425,109 | B1 | 7/2002 | Choukalos et al. |
| 6,429,882 | B1 | 8/2002 | Abdelnur et al. |
| 6,430,305 | B1 | 8/2002 | Decker |
| 6,433,645 | B1 | 8/2002 | Mann et al. |
| 6,434,187 | B1 | 8/2002 | Beard |
| 6,437,805 | B1 * | 8/2002 | Sojoodi et al. .................. 345/763 |
| 6,438,565 | B1 | 8/2002 | Ammirato et al. |
| 6,438,735 | B1 | 8/2002 | McElvain et al. |
| 6,438,738 | B1 | 8/2002 | Elayda |
| 6,441,073 | B1 | 8/2002 | Tanaka et al. |
| 6,445,211 | B1 | 9/2002 | Saripella |
| 6,449,628 | B1 | 9/2002 | Wasson |
| 6,449,755 | B1 | 9/2002 | Beausang et al. |
| 6,449,761 | B1 | 9/2002 | Greidinger et al. |
| 6,452,437 | B1 | 9/2002 | Takeuchi et al. |
| 6,452,514 | B1 | 9/2002 | Philipp |
| 6,453,175 | B2 | 9/2002 | Mizell et al. |
| 6,453,461 | B1 | 9/2002 | Chaiken |
| 6,456,304 | B1 | 9/2002 | Angiulo et al. |
| 6,457,355 | B1 | 10/2002 | Philipp |
| 6,457,479 | B1 | 10/2002 | Zhuang et al. |
| 6,460,172 | B1 | 10/2002 | Insenser Farre et al. |
| 6,463,488 | B1 | 10/2002 | San Juan |
| 6,466,036 | B1 | 10/2002 | Philipp |
| 6,466,078 | B1 | 10/2002 | Stiff |
| 6,466,898 | B1 | 10/2002 | Chan |
| 6,473,069 | B1 | 10/2002 | Gerpheide |
| 6,473,825 | B1 | 10/2002 | Worley et al. |
| 6,477,691 | B1 | 11/2002 | Bergamashi/Rab et al. |
| 6,480,921 | B1 | 11/2002 | Mansoorian et al. |
| 6,483,343 | B1 | 11/2002 | Faith et al. |
| 6,487,700 | B1 | 11/2002 | Fukushima |
| 6,489,899 | B1 | 12/2002 | Ely et al. |
| 6,490,213 | B1 | 12/2002 | Mu et al. |
| 6,492,834 | B1 | 12/2002 | Lytle et al. |
| 6,496,969 | B2 * | 12/2002 | Feng et al. ...................... 716/12 |
| 6,496,971 | B1 | 12/2002 | Lesea et al. |
| 6,498,720 | B2 | 12/2002 | Glad |
| 6,499,134 | B1 | 12/2002 | Buffet et al. |
| 6,499,359 | B1 | 12/2002 | Washeleski et al. |
| 6,504,403 | B2 | 1/2003 | Bangs et al. |
| 6,507,214 | B1 | 1/2003 | Snyder |
| 6,507,215 | B1 | 1/2003 | Piasecki et al. |
| 6,507,857 | B1 | 1/2003 | Yalcinalp |
| 6,509,758 | B2 | 1/2003 | Piasecki et al. |
| 6,512,395 | B1 | 1/2003 | Lacey et al. |
| 6,516,428 | B2 | 2/2003 | Wenzel et al. |
| 6,522,128 | B1 | 2/2003 | Ely et al. |
| 6,523,416 | B2 | 2/2003 | Takagi et al. |
| 6,525,593 | B1 | 2/2003 | Mar |
| 6,526,556 | B1 | 2/2003 | Stoica et al. |
| 6,529,791 | B1 | 3/2003 | Takagi |
| 6,530,065 | B1 | 3/2003 | McDonald et al. |
| 6,534,970 | B1 | 3/2003 | Ely et al. |
| 6,535,061 | B2 | 3/2003 | Darmawaskita et al. |
| 6,535,200 | B2 | 3/2003 | Philipp |
| 6,535,946 | B1 | 3/2003 | Bryant et al. |
| 6,536,014 | B1 * | 3/2003 | McClannahan et al. .......... 716/1 |
| 6,536,028 | B1 | 3/2003 | Katsioulas et al. |
| 6,539,534 | B1 | 3/2003 | Bennett |
| 6,542,025 | B1 | 4/2003 | Kutz et al. |
| 6,542,844 | B1 | 4/2003 | Hanna |
| 6,542,845 | B1 | 4/2003 | Grucci et al. |
| 6,546,297 | B1 | 4/2003 | Gaston et al. |
| 6,552,933 | B2 | 4/2003 | Roohparvar |
| 6,553,057 | B1 | 4/2003 | Sha |
| 6,554,469 | B1 | 4/2003 | Thomson et al. |
| 6,556,044 | B2 | 4/2003 | Langhammer et al. |
| 6,557,164 | B1 | 4/2003 | Faustini |
| 6,559,685 | B2 | 5/2003 | Green |
| 6,560,306 | B1 | 5/2003 | Duffy |
| 6,560,699 | B1 | 5/2003 | Konkle |
| 6,563,391 | B1 | 5/2003 | Mar |
| 6,564,179 | B1 | 5/2003 | Belhaj |
| 6,566,961 | B2 | 5/2003 | Dasgupta et al. |
| 6,567,426 | B1 | 5/2003 | van Hook et al. |
| 6,567,932 | B2 | 5/2003 | Edwards et al. |
| 6,570,557 | B1 | 5/2003 | Westerman et al. |
| 6,570,596 | B2 * | 5/2003 | Frederiksen .................. 345/808 |
| 6,571,331 | B2 | 5/2003 | Henry et al. |
| 6,571,373 | B1 | 5/2003 | Devins et al. |
| 6,574,590 | B1 | 6/2003 | Kershaw et al. |
| 6,574,739 | B1 | 6/2003 | Kung et al. |
| 6,575,373 | B1 | 6/2003 | Nakano |
| 6,577,258 | B2 | 6/2003 | Ruha et al. |
| 6,578,174 | B2 | 6/2003 | Zizzo |
| 6,580,329 | B2 | 6/2003 | Sander |
| 6,581,191 | B1 | 6/2003 | Schubert et al. |
| 6,587,093 | B1 | 7/2003 | Shaw et al. |
| 6,587,995 | B1 | 7/2003 | Duboc et al. |
| 6,588,004 | B1 | 7/2003 | Southgate et al. |
| 6,590,422 | B1 | 7/2003 | Dillon |
| 6,590,589 | B1 | 7/2003 | Sluiman et al. |
| 6,591,369 | B1 | 7/2003 | Edwards et al. |
| 6,592,626 | B1 | 7/2003 | Bauchot et al. |
| 6,594,799 | B1 | 7/2003 | Robertson et al. |
| 6,597,212 | B1 | 7/2003 | Wang et al. |
| 6,597,824 | B2 | 7/2003 | Newberg et al. |
| 6,598,178 | B1 | 7/2003 | Lee et al. |
| 6,600,346 | B1 | 7/2003 | Macaluso |
| 6,600,351 | B2 | 7/2003 | Bisanti et al. |
| 6,600,575 | B1 | 7/2003 | Kohara |
| 6,601,189 | B1 | 7/2003 | Edwards et al. |
| 6,601,236 | B1 | 7/2003 | Curtis |
| 6,603,330 | B1 | 8/2003 | Snyder |
| 6,603,348 | B1 | 8/2003 | Preuss et al. |
| 6,604,179 | B2 | 8/2003 | Volk et al. |
| 6,606,731 | B1 | 8/2003 | Baum et al. |
| 6,608,472 | B1 | 8/2003 | Kutz et al. |
| 6,610,936 | B2 | 8/2003 | Gillespie et al. |
| 6,611,220 | B1 | 8/2003 | Snyder |
| 6,611,276 | B1 | 8/2003 | Muratori et al. |
| 6,611,856 | B1 | 8/2003 | Liao et al. |
| 6,611,952 | B1 | 8/2003 | Prakash et al. |
| 6,613,098 | B1 | 9/2003 | Sorge et al. |
| 6,614,260 | B1 | 9/2003 | Welch et al. |
| 6,614,320 | B1 | 9/2003 | Sullam et al. |
| 6,614,374 | B1 | 9/2003 | Gustavsson et al. |
| 6,614,458 | B1 * | 9/2003 | Lambert et al. ................ 345/856 |
| 6,615,167 | B1 | 9/2003 | Devins et al. |
| 6,617,888 | B2 | 9/2003 | Volk |
| 6,618,854 | B1 | 9/2003 | Mann |
| 6,621,356 | B2 | 9/2003 | Gotz et al. |
| 6,624,640 | B2 | 9/2003 | Lund et al. |
| 6,625,765 | B1 | 9/2003 | Krishnan |
| 6,628,163 | B2 | 9/2003 | Dathe et al. |
| 6,628,311 | B1 | 9/2003 | Fang |
| 6,631,508 | B1 | 10/2003 | Williams |
| 6,634,008 | B1 | 10/2003 | Dole |
| 6,634,009 | B1 | 10/2003 | Molson et al. |
| 6,636,096 | B2 | 10/2003 | Schaffer et al. |
| 6,636,169 | B1 | 10/2003 | Distinti et al. |
| 6,637,015 | B1 | 10/2003 | Ogami et al. |
| 6,639,586 | B2 | 10/2003 | Gerpheide |
| 6,642,857 | B1 | 11/2003 | Schediwy et al. |
| 6,643,151 | B1 | 11/2003 | Nebrigic et al. |
| 6,643,810 | B2 | 11/2003 | Whetsel |
| 6,649,924 | B1 | 11/2003 | Philipp et al. |
| 6,650,581 | B2 | 11/2003 | Hong et al. |

| | | | | | | |
|---|---|---|---|---|---|---|
| 6,658,498 | B1 | 12/2003 | Carney et al. | 6,788,521 B2 | 9/2004 | Nishi |
| 6,658,633 | B2 | 12/2003 | Devins et al. | 6,791,377 B2 | 9/2004 | Ilchmann et al. |
| 6,661,288 | B2 | 12/2003 | Morgan et al. | 6,792,584 B1 | 9/2004 | Eneboe et al. |
| 6,661,410 | B2 | 12/2003 | Casebolt et al. | 6,798,218 B2 | 9/2004 | Kasperkovitz |
| 6,661,724 | B1 | 12/2003 | Snyder et al. | 6,798,299 B1 | 9/2004 | Mar et al. |
| 6,664,978 | B1 | 12/2003 | Kekic et al. | 6,799,198 B1 | 9/2004 | Huboi et al. |
| 6,664,991 | B1 * | 12/2003 | Chew et al. .................... 345/863 | 6,806,771 B1 | 10/2004 | Hilderbrant et al. |
| 6,667,642 | B1 | 12/2003 | Moyal | 6,806,782 B2 | 10/2004 | Motoyoshi et al. |
| 6,667,740 | B2 | 12/2003 | Ely et al. | 6,809,275 B1 | 10/2004 | Cheng et al. |
| 6,670,852 | B1 | 12/2003 | Hauck | 6,809,566 B1 | 10/2004 | Xin-LeBlanc |
| 6,671,869 | B2 | 12/2003 | Davidson et al. | 6,810,442 B1 | 10/2004 | Lin et al. |
| 3,378,877 | A1 | 1/2004 | Perry et al. | 6,815,979 B2 | 11/2004 | Ooshita |
| 6,673,308 | B2 | 1/2004 | Hino et al. | 6,816,544 B1 | 11/2004 | Bailey et al. |
| 6,677,814 | B2 | 1/2004 | Low et al. | 6,817,005 B2 | 11/2004 | Mason et al. |
| 6,677,932 | B1 | 1/2004 | Westerman | 6,819,142 B2 | 11/2004 | Viehmann et al. |
| 6,678,645 | B1 | 1/2004 | Rajsuman et al. | 6,823,282 B1 | 11/2004 | Snyder |
| 6,680,632 | B1 | 1/2004 | Meyers et al. | 6,823,497 B2 | 11/2004 | Schubert et al. |
| 6,680,731 | B2 | 1/2004 | Gerpheide et al. | 6,825,689 B1 | 11/2004 | Snyder |
| 6,681,280 | B1 | 1/2004 | Miyake et al. | 6,825,869 B2 | 11/2004 | Snyder |
| 6,681,359 | B1 | 1/2004 | Au et al. | 6,828,824 B2 | 12/2004 | Betz et al. |
| 6,683,462 | B2 | 1/2004 | Shimizu | 6,829,727 B1 | 12/2004 | Pawloski |
| 6,683,930 | B1 | 1/2004 | Dalmia | 6,834,384 B2 | 12/2004 | Fiorella, III et al. |
| 6,686,787 | B2 | 2/2004 | Ling | 6,836,169 B2 | 12/2004 | Richmond et al. |
| 6,686,860 | B2 | 2/2004 | Gulati et al. | 6,839,774 B1 | 1/2005 | Ahn et al. |
| 6,690,224 | B1 | 2/2004 | Moore | 6,842,710 B1 | 1/2005 | Gehring et al. |
| 6,691,193 | B1 | 2/2004 | Wang et al. | 6,847,203 B1 | 1/2005 | Conti et al. |
| 6,691,301 | B2 | 2/2004 | Bowen | 6,850,117 B2 | 2/2005 | Weber et al. |
| 6,697,754 | B1 * | 2/2004 | Alexander .................... 702/119 | 6,850,554 B1 | 2/2005 | Sha |
| 6,701,340 | B1 | 3/2004 | Gorecki | 6,853,598 B2 | 2/2005 | Chevallier |
| 6,701,487 | B1 | 3/2004 | Ogami et al. | 6,854,067 B1 | 2/2005 | Kutz et al. |
| 6,701,508 | B1 | 3/2004 | Bartz et al. | 6,856,433 B2 | 2/2005 | Hatano et al. |
| 6,703,961 | B2 | 3/2004 | Mueck et al. | 6,859,884 B1 | 2/2005 | Sullam |
| 6,704,381 | B1 | 3/2004 | Moyal et al. | 6,862,240 B2 | 3/2005 | Burgan |
| 6,704,879 | B1 | 3/2004 | Parrish | 6,864,710 B1 | 3/2005 | Lacey et al. |
| 6,704,889 | B2 | 3/2004 | Veenstra et al. | 6,865,429 B1 | 3/2005 | Schneider et al. |
| 6,704,893 | B1 | 3/2004 | Bauwens et al. | 6,865,504 B2 | 3/2005 | Larson et al. |
| 6,705,511 | B1 | 3/2004 | Dames et al. | 6,868,500 B1 | 3/2005 | Kutz et al. |
| 6,711,226 | B1 | 3/2004 | Williams et al. | 6,871,253 B2 | 3/2005 | Greeff et al. |
| 6,711,731 | B2 | 3/2004 | Weiss | 6,871,331 B1 | 3/2005 | Bloom et al. |
| 6,713,897 | B2 | 3/2004 | Caldwell | 6,873,203 B1 | 3/2005 | Latham, II et al. |
| 6,714,066 | B2 | 3/2004 | Gorecki et al. | 6,873,210 B2 | 3/2005 | Mulder et al. |
| 6,714,817 | B2 | 3/2004 | Daynes et al. | 6,876,941 B2 | 4/2005 | Nightingale |
| 6,715,132 | B1 | 3/2004 | Bartz et al. | 6,880,086 B2 | 4/2005 | Kidder et al. |
| 6,717,474 | B2 | 4/2004 | Chen et al. | 6,888,453 B2 | 5/2005 | Lutz et al. |
| 6,718,294 | B1 | 4/2004 | Bortfeld | 6,888,538 B2 | 5/2005 | Ely et al. |
| 6,718,520 | B1 | 4/2004 | Merryman et al. | 6,892,310 B1 | 5/2005 | Kutz et al. |
| 6,718,533 | B1 | 4/2004 | Schneider et al. | 6,892,322 B1 | 5/2005 | Snyder |
| 6,724,220 | B1 | 4/2004 | Snyder et al. | 6,893,724 B2 | 5/2005 | Lin et al. |
| 6,725,441 | B1 | 4/2004 | Keller et al. | 6,894,928 B2 | 5/2005 | Owen |
| 6,728,900 | B1 | 4/2004 | Meli | 6,897,390 B2 | 5/2005 | Caldwell et al. |
| 6,728,902 | B2 | 4/2004 | Kaiser et al. | 6,898,703 B1 | 5/2005 | Ogami et al. |
| 6,730,863 | B1 | 5/2004 | Gerpheide | 6,900,663 B1 | 5/2005 | Roper et al. |
| 6,731,552 | B2 | 5/2004 | Perner | 6,901,014 B2 | 5/2005 | Son et al. |
| 6,732,068 | B2 | 5/2004 | Sample et al. | 6,901,563 B1 | 5/2005 | Ogami et al. |
| 6,732,347 | B1 | 5/2004 | Bixler et al. | 6,903,402 B2 | 6/2005 | Miyazawa |
| 6,738,858 | B1 | 5/2004 | Fernald et al. | 6,903,613 B1 | 6/2005 | Mitchell et al. |
| 6,744,323 | B1 | 6/2004 | Moyal et al. | 6,904,570 B2 | 6/2005 | Foote et al. |
| 6,745,369 | B1 | 6/2004 | May et al. | 6,910,126 B1 | 6/2005 | Mar et al. |
| 6,748,569 | B1 | 6/2004 | Brooke et al. | 6,911,857 B1 | 6/2005 | Stiff |
| 6,750,852 | B2 | 6/2004 | Gillespie et al. | 6,917,661 B1 | 7/2005 | Scott et al. |
| 6,750,876 | B1 | 6/2004 | Atsatt et al. | 6,922,821 B1 | 7/2005 | Nemecek |
| 6,750,889 | B1 | 6/2004 | Livingston et al. | 6,924,668 B2 | 8/2005 | Muller et al. |
| 6,754,101 | B2 | 6/2004 | Terzioglu et al. | 6,934,674 B1 | 8/2005 | Douezy et al. |
| 6,754,723 | B2 | 6/2004 | Kato | 6,937,075 B2 | 8/2005 | Lim et al. |
| 6,754,765 | B1 | 6/2004 | Chang et al. | 6,940,356 B2 | 9/2005 | McDonald et al. |
| 6,754,849 | B2 | 6/2004 | Tamura | 6,941,336 B1 | 9/2005 | Mar |
| 6,757,882 | B2 | 6/2004 | Chen et al. | 6,941,538 B2 | 9/2005 | Hwang et al. |
| 6,765,407 | B1 | 7/2004 | Snyder | 6,944,018 B2 | 9/2005 | Caldwell |
| 6,768,337 | B2 | 7/2004 | Kohno et al. | 6,949,811 B2 | 9/2005 | Miyazawa |
| 6,768,352 | B1 | 7/2004 | Maher et al. | 6,949,984 B2 | 9/2005 | Siniscalchi |
| 6,769,622 | B1 | 8/2004 | Tournemille et al. | 6,950,954 B1 | 9/2005 | Sullam et al. |
| 6,771,552 | B2 | 8/2004 | Fujisawa | 6,950,990 B2 | 9/2005 | Rajarajan et al. |
| 6,774,644 | B2 | 8/2004 | Eberlein | 6,952,778 B1 | 10/2005 | Snyder |
| 6,781,456 | B2 | 8/2004 | Pradhan | 6,954,511 B2 | 10/2005 | Tachimori |
| 6,782,068 | B1 | 8/2004 | Wilson et al. | 6,954,904 B2 | 10/2005 | White |
| 6,784,821 | B1 | 8/2004 | Lee | 6,956,419 B1 | 10/2005 | Mann et al. |
| 6,785,881 | B1 | 8/2004 | Bartz et al. | 6,957,180 B1 | 10/2005 | Nemecek |
| 6,788,116 | B1 | 9/2004 | Cook et al. | 6,957,242 B1 | 10/2005 | Snyder |
| 6,788,221 | B1 | 9/2004 | Ely et al. | 6,961,686 B2 | 11/2005 | Kodosky et al. |

| Patent | Kind | Date | Inventor |
|---|---|---|---|
| 6,963,233 | B2 | 11/2005 | Puccio et al. |
| 6,963,908 | B1 | 11/2005 | Lynch et al. |
| 6,966,039 | B1 | 11/2005 | Bartz et al. |
| 6,967,511 | B1 | 11/2005 | Sullam |
| 6,967,960 | B1 | 11/2005 | Bross et al. |
| 6,969,978 | B2 | 11/2005 | Dening |
| 6,970,844 | B1 | 11/2005 | Bierenbaum |
| 6,971,004 | B1 | 11/2005 | Pleis et al. |
| 6,973,400 | B2 | 12/2005 | Cahill-O'Brien et al. |
| 6,975,123 | B1 | 12/2005 | Malang et al. |
| 6,980,060 | B2 | 12/2005 | Boerstler et al. |
| 6,981,090 | B1 | 12/2005 | Kutz et al. |
| 6,988,192 | B2 | 1/2006 | Snider |
| 6,996,799 | B1 | 2/2006 | Cismas et al. |
| 7,005,933 | B1 | 2/2006 | Shutt |
| 7,009,444 | B1 | 3/2006 | Scott |
| 7,010,773 | B1 | 3/2006 | Bartz et al. |
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |
| 7,030,782 | B2 | 4/2006 | Ely et al. |
| 7,034,603 | B2 | 4/2006 | Brady et al. |
| 7,042,301 | B2 | 5/2006 | Sutardja |
| 7,047,166 | B2 | 5/2006 | Dancea |
| 7,055,035 | B2 | 5/2006 | Allison et al. |
| 7,058,921 | B1 | 6/2006 | Hwang et al. |
| 7,073,158 | B2 | 7/2006 | McCubbrey |
| 7,076,420 | B1 | 7/2006 | Snyder et al. |
| 7,079,166 | B1 | 7/2006 | Hong |
| 7,086,014 | B1 | 8/2006 | Bartz et al. |
| 7,088,166 | B1 | 8/2006 | Reinschmidt et al. |
| 7,089,175 | B1 | 8/2006 | Nemecek et al. |
| 7,091,713 | B2 | 8/2006 | Erdelyi et al. |
| 7,092,980 | B1 | 8/2006 | Mar et al. |
| 7,098,414 | B2 | 8/2006 | Caldwell |
| 7,099,818 | B1 | 8/2006 | Nemecek |
| 7,100,133 | B1 | 8/2006 | Melyappan et al. |
| 7,103,108 | B1 | 9/2006 | Beard |
| 7,109,978 | B2 | 9/2006 | Gillespie et al. |
| 7,117,485 | B2 | 10/2006 | Wilkinson et al. |
| 7,119,550 | B2 | 10/2006 | Kitano et al. |
| 7,119,602 | B2 | 10/2006 | Davis |
| 7,124,376 | B2 | 10/2006 | Zaidi et al. |
| 7,127,630 | B1 | 10/2006 | Snyder |
| 7,129,793 | B2 | 10/2006 | Gramegna |
| 7,129,873 | B2 | 10/2006 | Kawamura |
| 7,132,835 | B1 | 11/2006 | Arcus |
| 7,133,140 | B2 | 11/2006 | Lukacs et al. |
| 7,133,793 | B2 | 11/2006 | Ely et al. |
| 7,138,841 | B1 | 11/2006 | Li |
| 7,138,868 | B2 | 11/2006 | Sanchez et al. |
| 7,139,530 | B2 | 11/2006 | Kusbel |
| 7,141,968 | B2 | 11/2006 | Hibbs et al. |
| 7,141,987 | B2 | 11/2006 | Hibbs et al. |
| 7,149,316 | B1 | 12/2006 | Kutz et al. |
| 7,150,002 | B1 | 12/2006 | Anderson et al. |
| 7,151,528 | B2 | 12/2006 | Taylor et al. |
| 7,152,027 | B2 | 12/2006 | Andrade et al. |
| 7,154,294 | B2 | 12/2006 | Liu et al. |
| 7,324,380 | B2 | 12/2006 | Negut et al. |
| 7,161,936 | B1 | 1/2007 | Barrass et al. |
| 7,162,410 | B1 | 1/2007 | Nemecek et al. |
| 7,171,455 | B1 | 1/2007 | Gupta et al. |
| 7,176,701 | B2 | 2/2007 | Wachi et al. |
| 7,178,096 | B2 | 2/2007 | Rangan et al. |
| 7,180,342 | B1 | 2/2007 | Shutt et al. |
| 7,185,162 | B1 | 2/2007 | Snyder |
| 7,185,321 | B1 | 2/2007 | Roe et al. |
| 7,188,063 | B1 | 3/2007 | Snyder |
| 7,193,901 | B2 | 3/2007 | Ruby et al. |
| 7,199,783 | B2 | 4/2007 | Wenstrand et al. |
| 7,200,507 | B2 | 4/2007 | Chen et al. |
| 7,206,733 | B1 | 4/2007 | Nemecek |
| 7,212,189 | B2 | 5/2007 | Shaw et al. |
| 7,221,187 | B1 | 5/2007 | Snyder et al. |
| 7,227,389 | B2 | 6/2007 | Gong et al. |
| 7,236,921 | B1 | 6/2007 | Nemecek et al. |
| 7,250,825 | B2 | 7/2007 | Wilson et al. |
| 7,256,588 | B2 | 8/2007 | Howard et al. |
| 7,265,633 | B1 | 9/2007 | Stiff |
| 7,281,846 | B2 | 10/2007 | McLeod |
| 7,282,905 | B2 | 10/2007 | Chen et al. |
| 7,283,151 | B2 | 10/2007 | Nihei et al. |
| 7,283,410 | B2 | 10/2007 | Hsu et al. |
| 7,287,112 | B1 | 10/2007 | Pleis et al. |
| 7,288,977 | B2 | 10/2007 | Stanley |
| 7,290,244 | B2 | 10/2007 | Peck et al. |
| 7,295,049 | B1 | 11/2007 | Moyal et al. |
| 7,298,124 | B2 | 11/2007 | Kan et al. |
| 7,301,835 | B2 | 11/2007 | Joshi et al. |
| 7,305,510 | B2 | 12/2007 | Miller |
| 7,307,485 | B1 | 12/2007 | Snyder et al. |
| 7,308,608 | B1 | 12/2007 | Pleis et al. |
| 7,312,616 | B2 | 12/2007 | Snyder |
| 7,323,879 | B2 | 1/2008 | Kuo et al. |
| 7,342,405 | B2 | 3/2008 | Eldridge et al. |
| 7,358,714 | B2 | 4/2008 | Watanabe et al. |
| 7,367,017 | B2 | 4/2008 | Maddocks et al. |
| 7,373,437 | B2 | 5/2008 | Seigneret et al. |
| 7,376,001 | B2 | 5/2008 | Joshi et al. |
| 7,386,740 | B2 | 6/2008 | Kutz et al. |
| 7,392,011 | B1 | 6/2008 | Jacomb-Hood |
| 7,400,183 | B1 | 7/2008 | Sivadasan et al. |
| 7,421,251 | B2 | 9/2008 | Westwick et al. |
| 7,461,274 | B1 | 12/2008 | Merkin |
| 7,466,307 | B2 | 12/2008 | Trent, Jr. et al. |
| 7,542,533 | B2 | 6/2009 | Jasa et al. |
| 7,554,847 | B2 | 6/2009 | Lee |
| 7,616,509 | B2 | 11/2009 | Qureshi et al. |
| 7,809,545 | B2 | 10/2010 | Ciofi et al. |
| 2001/0002129 | A1 | 5/2001 | Zimmerman et al. |
| 2001/0010083 | A1 | 7/2001 | Satoh |
| 2001/0038392 | A1 | 11/2001 | Humpleman et al. |
| 2001/0043081 | A1 | 11/2001 | Rees |
| 2001/0044927 | A1 | 11/2001 | Karniewicz |
| 2001/0045861 | A1 | 11/2001 | Bloodworth et al. |
| 2001/0047509 | A1 | 11/2001 | Mason et al. |
| 2002/0010716 | A1 | 1/2002 | McCartney et al. |
| 2002/0016706 | A1 | 2/2002 | Cooke et al. |
| 2002/0023110 | A1 | 2/2002 | Fortin et al. |
| 2002/0042696 | A1 | 4/2002 | Garcia et al. |
| 2002/0052729 | A1 | 5/2002 | Kyung et al. |
| 2002/0059543 | A1 | 5/2002 | Cheng et al. |
| 2002/0063688 | A1 | 5/2002 | Shaw et al. |
| 2002/0065646 | A1 | 5/2002 | Waldie et al. |
| 2002/0068989 | A1 | 6/2002 | Ebisawa et al. |
| 2002/0073119 | A1 | 6/2002 | Richard |
| 2002/0073380 | A1 | 6/2002 | Cooke et al. |
| 2002/0085020 | A1 | 7/2002 | Carroll, Jr. |
| 2002/0091739 | A1 | 7/2002 | Ferlitsch et al. |
| 2002/0099863 | A1 | 7/2002 | Comeau et al. |
| 2002/0109722 | A1 | 8/2002 | Rogers et al. |
| 2002/0116168 | A1 | 8/2002 | Kim |
| 2002/0122060 | A1 | 9/2002 | Markel |
| 2002/0129334 | A1 | 9/2002 | Dane et al. |
| 2002/0133771 | A1 | 9/2002 | Barnett |
| 2002/0133794 | A1 | 9/2002 | Kanapathippillai et al. |
| 2002/0138516 | A1 | 9/2002 | Igra |
| 2002/0121679 | A1 | 10/2002 | Bazarjani et al. |
| 2002/0144099 | A1 | 10/2002 | Muro, Jr. et al. |
| 2002/0145433 | A1 | 10/2002 | Morrise et al. |
| 2002/0152234 | A1 | 10/2002 | Estrada et al. |
| 2002/0152449 | A1 | 10/2002 | Lin |
| 2002/0156885 | A1 | 10/2002 | Thakkar |
| 2002/0156929 | A1 | 10/2002 | Hekmatpour |
| 2002/0156998 | A1 | 10/2002 | Casselman |
| 2002/0161802 | A1 | 10/2002 | Gabrick et al. |
| 2002/0166100 | A1 | 11/2002 | Meding |
| 2002/0174134 | A1 | 11/2002 | Goykhman |
| 2002/0174411 | A1 | 11/2002 | Feng et al. |

| | | | |
|---|---|---|---|
| 2002/0188910 | A1 | 12/2002 | Zizzo |
| 2002/0191029 | A1 | 12/2002 | Gillespie et al. |
| 2003/0011639 | A1* | 1/2003 | Webb ............................ 345/808 |
| 2003/0014447 | A1 | 1/2003 | White |
| 2003/0025734 | A1 | 2/2003 | Boose et al. |
| 2003/0033588 | A1 | 2/2003 | Alexander |
| 2003/0041235 | A1 | 2/2003 | Meyer |
| 2003/0056071 | A1 | 3/2003 | Triece et al. |
| 2003/0058469 | A1 | 3/2003 | Buis et al. |
| 2003/0061572 | A1 | 3/2003 | McClannahan et al. |
| 2003/0062889 | A1 | 4/2003 | Ely et al. |
| 2003/0066057 | A1 | 4/2003 | RuDusky |
| 2003/0080755 | A1 | 5/2003 | Kobayashi |
| 2003/0086300 | A1 | 5/2003 | Noyes et al. |
| 2003/0097640 | A1 | 5/2003 | Abrams et al. |
| 2003/0105620 | A1 | 6/2003 | Bowen |
| 2003/0126947 | A1 | 7/2003 | Margaria |
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2003/0229877 | A1 | 12/2003 | Bersch et al. |
| 2004/0018711 | A1 | 1/2004 | Madurawe |
| 2004/0054821 | A1 | 3/2004 | Warren et al. |
| 2004/0153802 | A1 | 8/2004 | Kudo et al. |
| 2004/0205553 | A1 | 10/2004 | Hall et al. |
| 2004/0205617 | A1 | 10/2004 | Light |
| 2004/0205695 | A1 | 10/2004 | Fletcher |
| 2004/0221238 | A1 | 11/2004 | Cifra et al. |
| 2005/0024341 | A1 | 2/2005 | Gillespie et al. |
| 2005/0066152 | A1 | 3/2005 | Garey |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0086668 | A1 | 4/2008 | Jefferson et al. |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |
| 2008/0294806 | A1 | 11/2008 | Swindle et al. |
| 2009/0322305 | A1 | 12/2009 | De Cremoux |

FOREIGN PATENT DOCUMENTS

| | | |
|---|---|---|
| EP | 0308583 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |
| EP | 0639816 A1 | 2/1995 |
| EP | 0639816 A2 | 2/1995 |
| EP | 1170671 A1 | 1/2002 |
| EP | 1170671 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

USPTO Notice of Allowance for U.S. Appl. No. 09/992,076. dated Nov. 13, 2008.
USPTO Notice of Allowance for U.S. Appl. No. 09/992,076, dated Mar. 26, 2006.
USPTO Final Rejection for U.S. Appl. No. 09/992,076 dated Nov. 29, 2007.
USPTO Non-Final Rejection for U.S. Appl. No. 09/992,076, dated Jan. 30, 2007.
USPTO Non-Final Rejection for U.S. Appl. No. 09/992,076, dated Aug. 10, 2006.
USPTO Final Rejection for U.S. Appl. No. 09/992,076, dated Mar. 17, 2006.
USPTO Non-Final Rejection for for U.S. Appl. No. 09/992,076, dated Nov. 21, 2005.
USPTO Non-Final Rejection for U.S. Appl. No. 09/992,076, dated Jun. 1, 2005.
USPTO Notice of Allowance for U.S. Appl. No. 09/994,600, dated Nov. 12, 2008.
USPTO Notice of Allowance for U.S. Appl. No. 09/994,600, dated May 14, 2008.
USPTO Final Rejection for U.S. Appl. No. 09/994,600 dated Oct. 17, 2007.
USPTO Non-Final Rejection for U.S. Appl. No. 09/994,600, dated May 15, 2007.
USPTO Final Rejection for U.S. Appl. No. 09/994,600, dated Dec. 8, 2006.
USPTO Non-Final Rejection for U.S. Appl. No. 09/994,600, dated Jul. 17, 2006.
USPTO Final Rejection for U.S. Appl. No. 09/994,600, dated Feb. 13, 2006.
USPTO Non-Final Rejection for U.S. Appl. No. 089/994,600, dated Aug. 23, 2005.
USPTO Final Rejection for U.S. Appl. No. 09/994,600, dated May 4, 2005.
USPTO Non-Final Rejection for for U.S. Appl. No. 09/994,600, dated Oct. 21, 2004.
USPTO Notice of Allowance for U.S. Appl. No. 10/001,477, dated Nov. 10, 2008.
USPTO Final Rejection for U.S. Appl. No. 10/001,477, dated Jun. 30, 2008.
USPTO Non-Final Rejection for U.S. Appl. No. 10/001,477, dated Dec. 6, 2007.
USPTO Final Rejection for U.S. Appl. No. 10/001,477, dated Jul. 23, 2007.
USPTO Non-Final Rejection for U.S. Appl. No. 10/001,477, dated Jan. 22, 2007.
USPTO Final Rejection for U.S. Appl. No. 10/001,477, dated Aug. 24, 2006.
USPTO Non-Final Rejection for U.S. Appl. No. 10/001,477, dated Mar. 2, 2006.
USPTO Final Rejection for U.S. Appl. No. 10/001,477, dated Oct. 24, 2005.
USPTO Non-Final Rejection for U.S. Appl. No. 10/001,477, dated May 11, 2005.
USPTO Notice of Allowance for U.S. Appl. No. 10/002,217, dated Jan. 28, 2009.
USPTO Notice of Allowance for U.S. Appl. No. 10/002,217, dated Oct. 14, 2008.
USPTO Notice of Allowance for U.S. Appl. No. 10/002,217, dated Jun. 6, 2008.
USPTO Final Rejection for U.S. Appl. No. 10/002,217, dated Feb. 6, 2008
USPTO Non-Final Rejection for U.S. Appl. No. 10/002,217, dated Aug. 3, 2007.
USPTO Final Rejection for U.S. Appl. No. 10/002,217 dated Mar. 7, 2007.
USPTO Non-Final Rejection for U.S. Appl. No. 10/002,217, dated Oct. 2, 2006.
USPTO Non-Final Rejection for U.S. Appl. No. 10/002,217, dated Apr. 3, 2006.
USPTO Non-Final Rejection for U.S. Appl. No. 10/002,217, dated May 19, 2005.
USPTO Notice of Allowance for for U.S. Appl. No. 09/980,777, dated Nov. 4, 2008.
USPTO Notice of Allowance for U.S. Appl. No. 09/989,777, dated Sep. 15, 2008.
USPTO Notice of Allowance for U.S. Appl. No. 09/989,777, dated Jul. 7, 2008.

USPTO Final Rejection for U.S. Appl. No. 09/989,777, dated Jan. 30, 2008.
USPTO Non-Final Rejection for U.S. Appl. No. 09/989,777, dated Sep. 11, 2007.
USPTO Final Rejectionfor U.S. Appl. No. 09/989,77, dated Mar. 13, 2007.
USPTO Non-Final Rejection for U.S. Appl. No. 09/989,777, dated Sep. 13, 2006.
USPTO Non-Final Rejection for U.S. Appl. No. 09/989,777, dated Apr. 11, 2006.
USPTO Final Rejection for U.S. Appl. No. 09/989,777, dated Dec. 21, 2005.
USPTO Non-Final Rejection for U.S. Appl. No. 09/989,777, dated Jul. 5, 2005.
USPTO Notice of Allowance for U.S. Appl. No. 09/994,901, dated Dec. 22, 2008.
USPTO Final Rejection for U.S. Appl. No.09/994,601, dated Apr. 17, 2008.
USPTO Non-Final Rejection for U.S. Appl. No. 09/994,601, dated Oct. 4, 2007.
USPTO Final Rejection for U.S. Appl. No. 09/994,601, dated May 18, 2007.
USPTO Non-Final Rejection for U.S. Appl. No. 09/994,601, dated Nov. 14, 2006.
USPTO Final Rejection for U.S. Appl. No. 09/994,601, dated Mar. 8, 2006.
USPTO Non-Final Rejection for U.S. Appl. No. 09/994,601, dated Sep. 21, 2005.
USPTO Final Rejection for U.S. Appl. No. 09/994,601, dated Mar. 24, 2005.
USPTO Non-Final Rejection for U.S. Appl. No. 09/994,601, dated Jul. 29, 2004.
USPTO Notice of Allowance for U.S. Appl. No. 10/008,096, dated Dec. 22, 2008.
USPTO Final Rejection for U.S. Appl. No. 10/008,096, dated Jun. 15, 2008.
USPTO Non-Final Rejection for U.S. Appl. No. 10/008,096, dated Dec. 12, 2007.
USPTO Final Rejection for U.S. Appl. No. 10/008,096, dated Sep. 4, 2007.
USPTO Non-Final Rejection for U.S. Appl. No. 10/008,096. dated Mar. 7, 2007.
USPTO Final Rejection for U.S. Appl. No. 10/008,096, dated Oct. 13, 2006.
USPTO Non-Final Rejection for U.S. Appl. No. 10/008,096, dated Apr. 17, 2006.
USPTO Final Rejection for U.S. Appl. No. 10/008,096, dated Nov. 25, 2005.
USPTO Non-Final Rejection for U.S. Appl. No. 10/008,096, dated Jun. 24, 2005.
USPTO Final Rejection for U.S. Appl. No. 10/008,096, dated Feb. 10, 2005.
USPTO Non-Final Rejection for U.S. Appl. No. 10/008,096, dated Jun. 14, 2004.
Anonymous, "F/Port: Fast Parallel Port for the PC", Installation Manual Release 7.1, circa 1997, available for download from http://www.fapo.com/fport.htm.
Anonymous, "Warp Nine Engineering—The IEEE 1284 Experts-F/Port Product Sheet," undated web page found at http://www.fapo.com/fport.htm, copyright 1998-2004.
Bursky. "FPGA Combines Multiple Interfaces and Logic," Electronic Design, vol. 48 No. 20, pp. 74-78 (Oct. 2, 2000).
"Webster's Third New International Dictionary" 1996, G. & C. Merriam Company pp. 1328-1329.
Five unnumbered pages from the Provisional U.S. Appl. No. 60/243,708 Oct. 26, 2000.
Ganapathy, GOPI, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996, pp. 315-318.
Hintz et al; "Microcontrollers", 1992, McGraw-Hill, pp. 29-37.
Ito, Sergio Akira and Carro, Luigi: "A Comparison of Microcontrollers Targeted to FPGS-Based Embedded Applications", Sep. 2000, Proceedings of 13th Symposium on integrated Circuits and Systems Design, Sep. 18-24, 2000, pp. 397-402.
Julio Faura et al.; "A Novel Mixed Signal Programmable Device With On-Chip Microprocessor", 1997, IEEE 1997 Custom integrated Circuits Conference, pp. 103-568.
Monte Mar, Bert Sullam, Eric Blom; "An architecture for a configurable Mixed-signal device", 2003, IEEE Journal of Solid-State Circuits, vol. 3, pp. 565-568.
Robinson, Gordon D; "Why 1149.1 (JTAG) Really Works", May 1994, Conference Proceedings Electro/94 International, May 10-12, 1994, Combined Volumes, pp. 749-754.
Walters, Stephen; "Computer-Aided Prototyping for ASIC, Based Systems", 1991, IEEE Design & Test of Computers; vol. 8, issue 2, pp. 4-10.
"PSoC designer: Integrated development enviornment, getting started 25-minute tutorial, version 1.0", Cypress Microsystems., Cypress Microsystems, Inc. CMS 10006A, Jul. 3, 2001, pp. 1-25, cited by examiner.
"PSoC technology complete changes 8-bit MCU system design", Cypress Microsystems, Inc. retrieved from <http:>://www.archive.org/web/20010219005250/http://cypressmicro.com./t . . . , Feb. 19, 2001. pp. 1-21, cited by examiner.
Specks et al., "A Mixed Digital-Analog 16B Microcontroller with 0.5MB Flash Memory, On-Chip Power Supply, Physical Nework Interface, and 40V I/O for Automotive Single-Chip Mechatronics, "IEEE, Feb. 9, 2000, pp. 348-349.
Hsieh et , "Modeling Micro-Controller Peripherals for High-Level Co-Simulation and Synthesis," IEEE 1997, pp. 127-130.
Dahl et al.; "Emulation of the Sparcle Microprocessor with the MIT Virtual Wires Emulation System"; 1994; IEEE; pp. 14-22.
Bauer et al.: "A Reconfigurable Logic Machine for Fast Event-Driven Simulation"; 1998, Design Automation Conference Proceedings; pp. 668-671.
Nam et aI.; "Fast Development of S rce-Level Debugging System Using Hardware Emulation"; IEEE 2000; pp. 40-404.
Huang et al. "Iceberg: An Embedded In-Cicuit Emulator Synthesizer for Microcontrollers"; ACM 1999; pp. 580-585.
Khan et al.; "FPGA Architectures for Asic Hardware Emulators"; IEEE 1993; pp. 336-340.
Oh et al.; Emulator Environment Based on an FPGA Prototyping Board; IEEE Jun. 21-23, 2909; pp. 72-77.
Hong et al.: "An FPGA-Based Hardware Emulator for Fast Fault Emulation"; IEEE 1997; pp. 345-348.
Ching et al.; "An In-Circuit-Emulator for TMS320C25"; IEEE 1994; pp. 51-56.
Pasternak; "In-Circuit-Emulation in ASIC Architecture Cor Designs"; IEEE 1989; pp. P6-4.1- P6-4.4.
Melear: "Using Background Modes for Testing, Debugging and Emulation of Microcontrollers"; IEEE 1997; pp. 90-97.
Anonymous; "JEEN JTAG Embedded Ice Ethernet Interface"; Aug. 1999, Embedded Performance, Inc.; 3 pages.
Sedory, "A Guide tea Debug"; 2004; retrievedn May 20, 2005.
"Microsoft Files Summary Judgement Motions"; Feb. 1999; Microsoft PressPass; retrieved on May 20, 2005 from http://www.microsoft.com/presspass/1999/feb99/Feb99/Calderapr.asp: pp. 1-6.
Xerox; "Mesa Debugger Documentation"; Apr. 1979; Xerox Systems Development Deparment; Version 5.0; pp. 1-30.
Stallman et al. "Debugging with the GNU Source-Level Debugger"; Jan. 1994; retrieved on May 2, 2005 from http://www.cs.utah.edu.
Wikipedia.org; "Von Neumann architecture"; retrieved from http://en.wikipedia.org/wiki/Von_Neumann_architecture on Jan. 22, 2007; pp. 1-5.
San Augarten; "The Chip Collection13 Introduction—Smithsonian Institute", "State of the Art"; "The First 256-Bit tatic RAM"; retrieved on Nov. 14, 2005 from http://smithsonianchips.siedu/augarten/p24.htm.
"Pod—Piece of Data, Plain Girl Documentation, Plain Old Dos . . . "; retrieved on Nov. 14, 2005 from http://www.auditmypc.com/acronym/POD.asp.
USPTO Notice of Allowance for U.S. Appl. No. 10/238,966 dated Jan. 27, 2009; 4 pages.
USPTO Non-Final Rejection for U.S. Appl. No. 10/238,966 dated Jun. 30, 2008; 12 pages.

USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Final Rejection for U.S. Appl. No. 10/002,217 dated Nov. 17, 2005; 17 pages.
USPTO Advisory Action for U.S. Appl. No. 10/001,477 dated Oct. 10, 2008; 3 pages.
"An Analog PPL,-Based Clock and Data Recovery Circuit with High Input Jitter Tolerance;" Sun, Reprinted from IEEE Journal of Solid-State Circuits, 1989; 4 pages.
"WP 3.5: An integrated Time Reference;" Blauschild, Digest of Technical Papers, 1994; 4 pages.
"Micropower CMOS Temperature Sensor with Digital Output;" Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz et al.; 25 pages.
U.S. Appl. No. 09/842,966: "Precision Crystal Oscillator Circuit Used in Microcontroller," Mar; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 091975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Notice of Allowance for U.S. Appl. No. 10/001,477 dated May 8, 2009; 6 pages.
U.S. Appl. No. 09/207,912: "Circuit(s), Architecture and Method(s) for Operating and/or Tuning a Ring Oscillator;" Mar; 23 pages.
USPTO Non-Final Rejection for U.S. Appl. No. 10/113,065 dated May 20, 2005; 14 pages.
USPTO Final Rejection for U.S. Appl. No. 10/113,065 dated Oct. 26, 2005; 17 pages.
USPTO Notice of Allowance for U.S. Appl. No. 10/113,065 dated Apr. 6, 2006; 8 pages.
USPTO Non-Final Rejection for U.S. Appl. No. 09/998,834 dated Sep. 20, 2004; 11 pages.
USPTO Notice of Allowance for U.S. Appl. No. 09/998,834 dated May 19, 2005; 7 pages.
USPTO Non-Final Rejection for U.S. Appl. No. 09/998,859 dated May 15, 2003; 6 pages.
USPTO Non-Final Rejection for U.S. Appl. No. 09/998,859 dated May 28, 2003; 6 pages.
USPTO Final Rejection for U.S. Appl. No. 09/998,859 dated Nov. 19, 2003; 5 pages.
USPTO Non-Final Rejection for U.S. Appl. No. 09/998,859 dated Nov. 4, 2004; 6 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 10/238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
Goodenough, F. "Analog Counterparts of FPGAS Ease System Design" Electronic Design, Penton Publishing, Cleveland, Oh, US vol. 42, No. 21, Oct. 14, 1994; 10 pages.
Harbaum, T. et al. "Design of a Flexible Coprocessor Unit" Proceedings of the Euromicro Conference, XX XX, Sep. 1999; 10 pages.

From U.S. Appl. No. 10/033,027; "Programmable Microcontroller (PSoC) Architecture (Mixed Analog/Digital)"; Aug. 7, 2001; U.S. Appl. No. 09/924,734 Snyder et al.; 28 pages.
From U.S. Appl. No. 10/033,027: "Digital Configurable Macro Architecture"; Jul. 18, 2001; U.S. Appl. No. 09/909,045; Snyder; 37 pages.
From U.S. Appl. No. 10/033,027: "Configuring Digital Functions in a Digital Configurable Macro Architecture"; Jul. 18, 2001; U.S. Appl. No. 09/909,109; Snyder; 38 pages.
From U.S. Appl. No. 10/033,027: "A Programmable Analog System Architecture (As Amended)"; Jul. 18, 2001; U.S. Appl. No. 09/909,047; Mar; 60 pages.
From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.
From U.S. Appl. No. 10/033,027: "Method for Synchronizing and Resetting Clock Signals Supplied to Multiple Programmable Analog Blocks (As Amended)"; Oct. 1, 2001; U.S. Appl. No. 09/969;311; Sullam; 57 pages.
From U.S. Appl. No. 10/033,027: "Method and Apparatus for Programming a Flash Memo"; Jun. 5, 2001; U.S. Appl. No. 09/875,599; Snyder; 23 pages.
From U.S. Appl. No. 10/033,027: "In-System Chip Emulator Architecture"; Oct. 10, 2001; U.S. Appl. No. 09/975,115; Snyder et al.; 38 pages.
From U.S. Appl. No. 10/033,027: "A Configurable Input/Output Interface for a Microcontroller"; Sep. 14, 2001; U.S. Appl. No. 09/953,423; Snyder; 28 pages.
From U.S. Appl. No. 10/033,027: "Multiple Use of Microcontroller Pad"; Jun. 26, 2001; U.S. Appl. No. 09/893,050; Kutz et al.; 21 pages.
From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Analog Blocks"; Oct. 1, 2001; U.S. Appl. No. 09/969,313; Sullam; 50 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
U.S. Appl. No. 09/935,454: "Method and Apparatus for Local and Global Power Management in a Programmable Analog Circuit;" Mar. 51 pages.
U.S. Appl. No. 09/923,461: "Non-Interfering Multiply-Mac (Multiply Accumulate) Circuit;" Snyder; 25 pages.
U.S. Appl. No. 09/922,579: "A Method for a Efficient Supply to a Microcontroller;" Kutz; 37 pages.
U.S. Appl. No. 09/922,419: "A Power Supply Pump Circuit for a Microcontroller;" Kutz; 38 pages.
U.S. Appl. No. 09/912,768: "A Microcontroller having a Dual Mode Relax Oscillator that is Trimmable;" Shutt; 33 pages.
U.S. Appl. No. 09/893,048: "A Microcontroller having an On-Chip High Gain Amplifier;" Kutz; 22 pages.
The Provisional U.S. Appl. No. 60/243,708 "Advanced Programmable Microcontroller Device"; Oct. 26, 2000; 277 pages.
USPTO Advisory Action for U.S. Appl. No. 09/998,848 dated Sep. 7, 2005; 3 pages.
U.S. Appl. No. 09/957,084 (CD00201): "A Crystal-Less Oscillator with Trimmable Analog Current Control for Increased Stability:" Mar.; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying instructions to Microprocessor in Test Mode;" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks:" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemecek; 43 pages.
U.S. Appl. No. 10/001,568: "Combined In-Circuit Emulator and Programmer:" Nemecek; 47 pages.
U.S. Appl. No. 10/001,478: "In-Circuit Emulator and Pod Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly:" Sullam; 24 pages.
USPTO Final Rejection for U.S. Appl. No. 09/989,778 dated Mar. 16, 2009; 26 pages.
USPTO Final Rejection for U.S. Appl. No. 09/989,765 dated Mar. 31, 2009; 18 pages.
USPTO Non-Final Rejection for U.S. Appl. No. 09/989,782 dated Dec. 14, 2007; 8 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Jan. 29, 2007; 9 pages.
USPTO Final Rejection for U.S. Appl. No. 09/989,782 dated Nov. 3, 2005; 11 pages.
USPTO Final Rejection for U.S. Appl. No. 09/989,782 dated Sep. 21, 2006; 10 pages.
USPTO Final Rejection for U.S. Appl. No. 09/989,782 dated Jul. 24, 2007; 9 pages.
USPTO Final Rejection for U.S. Appl. No. 09/989,782 dated Jul. 9, 2008; 10 pages.
USPTO Non-Final Rejection for U.S. Appl. No. 09/989,765 dated Oct. 5, 2005; 9 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Sep. 19, 2007; 14 pages.
USPTO Final Rejection for U.S. Appl. No. 09/989,765 dated Apr. 17, 2006; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 3, 2007; 12 pages.
USPTO Non-Final Rejection for U.S. Appl. No. 09/989,771 dated Sep. 22, 2004; 7 pages.
USPTO Non-Final Rejection for U.S. Appl. No. 09/989,767 dated Oct. 6, 2004; 15 pages.

USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www.algonet.se/~staffann/developer/emulator.htm; 6 pages.
"Capturing Test/Emulation and Enabling Real-Time Debugging Using FPGA for in-Circuit Emulation;" Oct. 10, 2001; U.S. Appl. No. 09/975,104; Snyder; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages (including page 18).
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.
"Emulator Chip-Board Architecture for Interface;" Oct. 10, 2001; U.S. Appl. No. 09/975,030; Snyder et al.; 37 pages.
Wikipedia—Main Page, retrieved on Mar. 8, 2006 from http://en.wikipedia.org/wiki/Main_Page and http://en.wikipedia. org/wiki/Wikipedia:Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
USPTO Non-Final Rejection for U.S. Appl. No. 09/989,767 dated Jul. 17, 2006; 12 pages.
USPTO Final Rejection for U.S. Appl. No. 09/989,767 dated Dec. 27, 2007; 21 pages.
"Host to FPGA Interface in an In-Circuit Emulation System;" Oct. 10, 2001; U.S. Appl. No. 09/975,105; Nemecek; 44 pages.
USPTO Advisory Action for U.S. Appl. No. 09/994,601 dated May 23, 2006; 3 pages.
USPTOo Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 091992,076 dated Mar, 26, 2008; 23 pages.
USPTO Notice of Allowance for U.S. Appl. No. 09/992,076 dated Jul. 29, 2008; 6 pages.

UPSTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 091989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for 09/989,767 dated Apr. 6, 2005; 13 pages.
U.S. Appl. No. 10/033,027: "Microcontrollable Programmable System on a Chip;" Snyder; 117 pages.
U.S. Appl. No. 10/803,030: "Programmable Microcontrollable Architecture (Mixed Analog/Digital);" Snyder; 13 pages.
USPTO Notice of Allowance for U.S. Appl. No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.

USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 091912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com; 4 pages.

Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815: "A Data Driven Method and System for Monitoring Hardware Resource Usage for Programming an Electric Device;" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Oct. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device:" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
"New Object Domain R3 Beta Now Available (Build 134)!" Mar. 13, 2001; <http://web.archive.org/ web/200100331202605/www.objectdomain.com/domain30/index.html; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.

Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XML" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers a New Level Of System Flexibility"; Electronic Design; Nov. 6, 2000; 11 pages.
Cypress MicroSystem, Inc. "Cypress Customer Forums" retrieved from <http://www.cypress.com/forums/messageview>; Nov. 30, 2004; 1 page.
Cypress MicroSystem, Inc, "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY__Announces__nov__13__2000.html; 3 pages.
Huang et al., ICEBERG, An Embedded In-Circuit Emulator Synthesizer for Microcontrollers, Proceedings of the 36th Design Automation Conference 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages.
U.S. Appl. No. 10/002,726: "Method and Apparatus for Generating Microcontroller Configuration Information," Ogami et at, filed on Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 101002,726 dated Dec. 13, 2004; 7 pages.
U.S. Appl. No. 11/818,005; "Techniques for Generating Microcontroller Configuration Information," Ogami et al., filed on Jun. 12, 2007; 61 pages.
USPTO Requirement for Restriction/Election for U.S. Appl. No. 11/818,005 dated Jul. 14, 2009; 5 pages.
U.S. Appl. No. 11/850,260: "Circuit and Method for Improving the Accuracy of a Crystal-less Oscillator Having Dual-Frequency Modes;" Wright et al.; 33 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.

USPTO Non-Final Rejection for U.S. Appl. No. 10/305,589 dated Oct. 7, 2003; 6 pages.

U.S. Appl. No. 10/305,589: "Current Controlled Delay Circuit," Stiff; 18 pages.

U.S. Appl. No. 09/849,164: "Reduced Static Phase Error CMOS PLL Charge Pump," Stiff; 30 pages.

Maneatis, "Low-Jitter Process-Independent DLL and PLL Based on Self-Biased Techniques," IEEE Journal of Solid-State Circuits, vol. 31, No. 11, Nov. 1996; 10 pages.

Larsson, "A 2-1600-MHz CMOS Clock Recovery PLL with Low-V dd Capability," IEEE Journal of Solid-State Circuits, vol. 34, No. 12, Dec. 1999; 10 pages.

USPTO Notice of Allowance for U.S. Appl. No. 10/327,217 dated Aug. 12, 2004; 6 pages.

USPTO Non-Final Rejection for U.S. Appl. No. 10/327,217 dated Apr. 30, 2004; 5 pages.

USPTO Miscellaneous Action for U.S. Appl. No. 10/327,217 dated Feb. 10, 2004; 1 page.

U.S. Appl. No. 10/327,217 : "Single Ended Clock Signal Generator Having a Differential Output," Richmond et al.; 27 pages.

USPTO Notice of Allowance for U.S. Appl. No. 10/871,582 dated Mar. 30, 2006; 6 pages.

USPTO Final Rejection for U.S. Appl. No. 10/871,582 dated Feb. 1, 2006; 5 pages.

USPTO Non-Final Rejection for U.S. Appl. No. 10/871,582 dated Sep. 7, 2005; 7 pages.

U.S. Appl. No. 10/871,582: "LVDS Input Circuit with Extended Common Mode Range," Reinschmidt et al.; 25 pages.

USPTO Notice of Allowance for U.S. Appl. No. 09/404,891 dated Mar. 4, 2005; 6 pages.

USPTO Final Rejection for U.S. Appl. No. 09/404,891 dated Dec. 8, 2004; 7 pages.

USPTO Non-Final Rejection for U.S. Appl. No. 09/404,891 dated Jun. 25, 2004; 6 pages.

USPTO Non-Final Rejection for U.S. Appl. No. 09/404,891 dated Jan. 5, 2004; 5 pages.

USPTO Non-Final Rejection for U.S. Appl. No. 09/404,891 dated Jul. 10, 2003; 6 pages.

USPTO Non-Final Rejection for U.S. Appl. No. 09/404,891 dated Mar. 5, 2003; 6 pages.

USPTO Non-Final Rejection for U.S. Appl. No. 09/404,891 dated Oct. 11, 2002; 5 pages.

U.S. Appl. No. 09/404,891: "Method, Architecture and Circuitry for Controlling Pulse Width in a Phase and/or Frequency Detector," Scott et al.; 17 pages.

USPTO Notice of Allowance for U.S. Appl. No. 10/226,911dated Aug. 20, 2004; 4 pages.

USPTO Non-Final Rejection for U.S. Appl. No. 10/226,911 dated Mar. 19, 2004; 6 pages.

U.S. Appl. No. 10/226,911: "Calibration of Integrated Circuit Time Constants," Gehring et al.; 32 pages.

USPTO Notice of Allowance for U.S. Appl. No. 09/943,149 dated Jan. 12, 2004; 7 pages.

USPTO Non-Final Rejection for U.S. Appl. No. 09/943,149 dated Aug. 28, 2003; 9 pages.

USPTO Final Rejection for U.S. Appl. No. 09/943,149 dated May 7, 2003; 10 pages.

USPTO Non-Final Rejection for U.S. Appl. No. 09/943,149 dated Nov. 20, 2002; 7 pages.

U.S. Appl. No. 09/943,149: "Method for Phase Locking in a Phase Lock Loop," Moyal et al.; 21 pages.

Durham et al., "Integrated Continuous-Time Balanced Filters for 16-bit DSP Interfaces," IEEE, 1993; 6 pages.

Durham et al., "Circuit Architectures for High Linearity Monolithic Continuous-Time Filtering," IEEE, 1992; 7 pages.

Durham et al., "High-Linearity Conitnuous-Time Filter in 5-V VLSI CMOS," IEEE, 1992; 8 pages.

U.S. Appl. No. 09/047,595: "Roving Range Control to Limit Receive Pll Frequency of Operation," Scott; 35 pages.

U.S. Appl. No. 09/216,460: "Circuit and Method for Controlling an Output of a Ring Oscillator," Abugharbieh et al.; 21 pages.

U.S. Appl. No. 09/471,914: "Reference-Free Clock Generator and Data Recovery Pll," Dalmia et al.; 32 pages.

U.S. Appl. No. 09/471,576: "Reference-Free Clock Generation and Data Recovery PLL," Dalmia; 30 pages.

U.S. Appl. No. 10/083,442: "Method/Architecture for a Low Gain PLL with Wide Frequency Range," Meyers et al.; 28 pages.

U.S. Appl. No. 09/470,665: "Digital Phase/Frequency Detector, and Clock Generator and Data Recovery PLL Containing the Same," Dalmia; 26 pages.

U.S. Appl. No. 09/893,161 : "Architecture of a PLL with Dynamic Frequency Control on a PLD," Moore; 32 pages.

U.S. Appl. No. 09/608,753: "PLL Lockout Watchdog," Wilson et al.; 24 pages.

U.S. Appl. No. 09/398,956: "Frequency Acquisition Rate Control in Phase Lock Loop Circuits," Moyal et al.; 35 pages.

U.S. Appl. No. 09/747,262: "Linearized Digital Phase-Locked Loop," Williams et al.; 9 pages.

U.S. Appl. No. 09/981,448: "Oscillator Tuning Method," Hauck; 28 pages.

U.S. Appl. No. 09/538,989: "Memory Based Phase Locked Loop," Krishnan; 27 pages.

U.S. Appl. No. 09/048,905: "Programmable Clock Generator," Mann et al.; 42 pages.

U.S. Appl. No. 08/865,342: "Programmable Clock Generator," Mann et al.; 41 pages.

USPTO Notice of Allowance for U.S. Appl. No. 10/293,392 dated Mar. 10, 2004; 6 pages.

USPTO Non-Final Rejection for U.S. Appl. No. 10/293,392 dated Oct. 16, 2003; 6 pages.

U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.

USPTO Notice of Allowance for U.S. Appl. No. 10/288,003 dated Jan. 14, 2005; 6 pages.

USPTO Final Rejection for U.S. Appl. No. 10/288,003 dated Oct. 6, 2004; 6 pages.

USPTO Non-Final Rejection for U.S. Appl. No. 10/288,003 dated Apr. 7, 2004; 9 pages.

U.S. Appl. No. 10/288,003: "Low Voltage Differential Signal Driver Circuit and Method," Roper et al.; 30 pages.

USPTO Notice of Allowance for U.S. Appl. No. 09/989,777 dated Jun. 9, 2009; 7 pages.

USPTO Advisory Action for U.S. Appl. No. 11/200,619 dated May 11, 2009; 3 pages.

USPTO Final Rejection for U.S. Appl. No. 11/200,619 dated Mar. 3, 2009; 14 pages.

USPTO Non-Final Rejection for U.S. Appl. No.11/200,619 dated Aug. 27, 2008; 13 pages U.S. Appl. No. 11/200,619: "Providing hardware independence to automate code generation of processing device firmware," Snyder at al.; 41 pages.

USPTO Notice of Allowance for U.S. Appl. No. 11/201,922 dated Apr. 9, 2009; 4 pages.

USPTO Non-Final Rejection for U.S. Appl. No. 11/201,922 dated Oct. 21, 2008; 12 pages.

USPTO Final Rejection for U.S. Appl. No. 11/201,922 dated Apr. 30, 2008; 10 pages.

USPTO Non-Final Rejection for U.S. Appl. No. 11/201,922 dated Oct. 15, 2007; 10 pages.

U.S. Appl. No. 11/201,922: "Design model for a hardware device-independent method of defining embedded firmware for programmable systems," McDonald et al.; 31 pages.

USPTO Non-Final Rejection for U.S. Appl. No. 11/201,627 dated Dec. 12, 2008; 17 pages.

USPTO Final Rejection for U.S. Appl. No. 11/201,627 dated Apr. 29, 2008; 21 pages.

USPTO Non-Final Rejection for U.S. Appl. No. 11/201,627 dated Nov. 16, 2007; 16 pages.

U.S. Appl. No. 11/201,627: "Method and an apparatus to design a processing system using a graphical user interface," Ogami et al.; 37 pages.

USPTO Notice of Allowance for U.S. Appl. No. 09/989,808 dated Feb. 13, 2006; 4 pages.

USPTO Non-Final Rejection for U.S. Appl. No. 09/989,808 dated Oct. 19, 2005; 8 pages.
USPTO Non-Final Rejection for Application No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTPO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 091979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
Uspto Non-Final Rejection for Application No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Final Rejection for U.S. Appl. No. 09/989,761dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using MATLAB," Proceedings of 23rd International Conference on Microelectronics (Miel 2002), vol. 2 NIS, Yugoslavia; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol, 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.

Kory Hopkins, "Definition;" Jan. 16, 1997; <http://www.cs.sfu.ca/cs/people/GradStudent.html>; 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project" <http://www.cs.washington.edu/research/projects/lis/vvww/gemini/gemini.html> larry@cs.washington.edu; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
U.S. Appl. No. 12/132,527: "System and Method for Performing Next Placements and Pruning of Disallowed Placements for Programming an Integrated Circuit;" Ogami et al.; 44 pages.
U.S. Appl. No. 12/356,468: "System and Method for Dynamically Generating a Configuration Datasheet," Anderson et al.; filed on Jan. 20, 2009; 27 pages.
International Search Report from the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
U.S. Appl. No. 09/475,879: "Programmable Logic Device," Lacey et al.; filed on Dec. 30, 1999; 50 pages.
U.S. Appl. No. 09/475,808: "Configurable Memory for Programmable Logic Circuits," Lacey et al.; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
U.S. Appl. No. 10/172,670: "Method and System for Programming a Memory Device," Snyder et al.; filed on Jun. 13, 2002; 66 pages.
U.S. Appl. No. 11/986,338: Reconfigurable Testing System and Method, Pleis et al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.

U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
U.S. Appl. No. 11/273,708: "Capacitance Sensor Using Relaxation Oscillators," Snyder et al.; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
U.S. Appl. No. 11/337,272: "Successive Approximate Capacitance Measurement Circuit;" Snyder; 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
U.S. Appl. No. 11/983,291: "Successive Approximate Capacitance Measurement Circuit," Snyder; 26 pages.
USPTO Non-Final Rejection for U.S. Appl. No. 11/983,291 dated Mar. 9, 2009; 9 pages.
U.S. Appl. No. 11/698,660: "Configurable Bus," Kutz et al.; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
U.S. Appl. No. 11/709,866: "Input/Output Multiplexer Bus," Dennis Sequine; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, Oxford University Press; 20 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse Interfacing, 2001; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.

U.S. Appl. No. 11/166,622: "Touch wake for electronic devices," Beard et al.; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
U.S. Appl. No. 10/024,093: "Configurable Memory for Programmable Logic Circuits," Lacey et al.; 25 pages.
U.S. Appl. No. 11/088,028: "Method and Circuit for Rapid Alignment of Signals," Moyal et al., filed on Nov. 13, 2007; 34 pages.
USPT Notice of Allowance for U.S. Appl. No. 11/088,028 dated Jul. 2, 2007; 6 pages.
USPT Notice of Allowance for Application No. 11/088,028 dated Jan. 26, 2007; 6 pages.
USPT Non-Final Rejection for U.S. Appl. No. 11/088,028 dated Jun. 16, 2006; 8 pages.
U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08160695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et at., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the International Searching Authority for International Application No. PCT/US08/60681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.

Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Final Rejection for U.S. Appl. No. 09/989,767 dated Dec. 7, 2009; 22 pages.
USPTO Final Rejection for U.S. Appl. No. 11/850,260 dated Aug. 21, 2009; 9 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 04, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
Uspto Advisory Action for U.S. Appl. No. 11/850,260 dated Nov. 2, 2009; 3 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Non-Final Rejection for U.S. Appl. No. 10/133,581 dated Feb. 24, 2006; 11 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.

USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Mooris Mano, "Computer System Architecture," 1982, Prentice-Hall, 2nd Edition, pp. 261-264 and 435-440; 14 pages.
Dirk Killat, "A One-Chip Solution for Electronic Ballasts in Fluorescent Lamps," Power Electronics, <http:// powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/ print/0804/eady169/2.htm>; 4 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
U.S. Appl. No. 12/058,586: "System and Method for Monitoring a Target Device," Ogami et al., filed on Mar. 28, 2008; 41 pages.
U.S. Appl. No. 12/058,534: "System and Method for Controlling a Target Device," Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 12/058,569: "Configuration of Programmable IC Design Elements," Best et al., filed on Mar. 28, 2008; 19 pages.
U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed Soc 320 Embedded Storage Switch," 2003, Vixel, pp. 1-5; 5 pages.
USPTO Notice of Allowance for U.S. Appl. No. 09/943,062 dated Jun. 29, 2010; 4 pages.
USPTO Miscellaneous Action for U.S. Appl. No. 10/113,581 dated Jun. 23, 2010; 6 pages.

USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Advisory Action for U.S. Appl. No. 11/818,005 dated Jul. 30, 2010; 3 pages.
USPTO Non-Final Rejection for U.S. Appl. No. 12/132,527 dated Apr. 29, 2010; 7 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated May 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 23, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 12, 2010; 15 pages.
USPTO Non-Final Rejection for U.S. Appl. No. 12/058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 11/968,145 dated Mar. 4, 2010; 11 pages.
USPTO Non-Final Rejection for U.S. Appl. No. 12/104,678 dated Jul. 10, 2010; 8 pages.
USPTO Advisory Action for U.S. Appl. No. 11/779,439 dated Mar. 30, 2009; 3 pages.
USPTO Notice of Allowance for U.S. Appl. No. 10/001,478 dated Sep. 7, 2010; 10 pages.
USPTO Notice of Allowance for U.S. Appl. No. 11/818,005 dated Oct. 26, 2010; 10 pages.
USPTO Final Rejection for U.S. Appl. No. 12/132,527 dated Oct. 14, 2010; 8 pages.
USPTO Non-Final Rejection for U.S. Appl. No. 11/201,627 dated Sep. 30, 2010; 6 pages.
USPTO Final Rejection for U.S. Appl. No. 11/698,660 dated Sep. 3, 2010; 19 pages.
USPTO Advisory Action for U.S. Appl. No. 11/698,660 dated Nov. 10, 2010; 3 pages.
USPTO Non-Final Rejection for U.S. Appl. No. 11/644,100 dated Sep. 15, 2010; 10 pages.
USPTO Non-Final Rejection for U.S. Appl. No. 11/201,922 dated Jun. 11, 2010; 12 pages.
USPTO Final Rejection for U.S. Appl. No. 12/060,176 dated Oct. 12, 2010; 22 pages.
USPTO Advisory Action for U.S. Appl. No. 12/136,577 dated Oct. 29, 2010; 3 pages.
USPTO Non-Final Rejection for U.S. Appl. No. 11/644,100 dated Dec. 16, 2009; 13 pages.
USPTO Final Rejection for U.S. Appl. No. 11/166,622 dated Mar. 18, 2010; 12 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.
USPTo Non-Final Rejection for U.S. Appl. No. 11/698,660 dated Dec. 13, 2010; 20 pages.
USPTO Notice of Allowance for U.S. Appl. No. 11/644,100 dated Jan. 6, 2011; 6 pages.
USPTO Non-Final Rejection for U.S. Appl. No. 11/201,922 dated Dec. 28, 2010; 14 pages.
USPTO Final Rejection for U.S. Appl. No. 11/166,622 dated Dec. 7, 2010; 12 pages.
USPTO Non-Final Rejection for U.S. Appl. No. 11/166,622 dated Jun. 22, 2010; 11 pages.
USPTO Final Rejection for U.S. Appl. No. 09/989,771 dated Jan. 4, 2011; 12 pages.
USPTO Non-Final Rejection for U.S. Appl. No. 09/975,338 dated Apr. 30, 2010; 10 pages.
USPTO Non-Final Rejection for U.S. Appl. No. 11/818,005 dated Oct. 26, 2010; 10 pages.
USPTO Non-Final Rejection for U.S. Appl. No. 11/968,145 dated Jan. 5, 2011; 8 pages.
USPTO Non-Final Rejection for U.S. Appl. No. 12/004,833 dated Dec. 21, 2010; 8 pages.
USPTO Notice of Allowance for U.S. Appl. No. 12/058,569 dated Dec. 13, 2010; 6 pages.
USPTO Non-Final Rejection for U.S. Appl. No. 09/989,782 dated Oct. 27, 2009; 9 pages.
USPTO Final Rejection for U.S. Appl. No. 12/104,678 dated Dec. 3, 2010; 9 pages.
USPTO Final Rejection for U.S. Appl. No. 11/857,947 dated Jan. 4, 2011; 14 pages.
USPTO Advisory Action for U.S. Appl. No. 09/994,601 dated Mar. 23, 2010; 2 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 23, 2010; 6 pages.
USPTO Notice of Allowance for U.S. Appl. No. 10/113,581 dated Sep. 3, 2010; 11 pages.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed on Mar. 28, 2008; 56 pages.
USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.

USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 31, 2005; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Notice of Allowance for U.S. Appl. No. 09/975,115 dated May 9, 2011; 11 pages.
USPTO Non-Final Rejection for U.S. Appl. No. 10/033,027 dated Mar. 15, 2011; 6 pages.
USPTO Notice of Allowance for U.S. Appl. No. 11/818,005 dated Mar. 23, 2011; 7 pages.
USPTO Requirement Restriction for U.S. Appl. No. 12/356,468 dated Apr. 22, 2011; 7 pages.
U.S. Appl. No. 12/356,468: "System and Method for Dynamically Generating a Configuration Datasheet," Anderson et al., filed on Jan. 20, 2009; 69 pages.
USPTO Notice of Allowance for U.S. Appl. No. 09/998,848 dated Feb. 17, 2011; 7 pages.
USPTO Non-Final Rejection for U.S. Appl. No. 12/136,557 dated May 5, 2011; 7 pages.
USPTO Non-Final Rejection for U.S. Appl. No. 09/975,338 dated Apr. 30, 2010; 2 pages.
USPTO Non-Final Rejection for U.S. Appl. No. 12/789,399 dated Mar. 10, 2011; 14 pages.
U.S. Appl. No. 12/789,399: "Model for a Hardware Device-Independent Method of Defining Embedded Firmware for Programmable Systems," McDonald et al., filed on May 27, 2010; 32 pages.
USPTO Notice of Allowance for U.S. Appl. No. 11/166,622 dated Apr. 15, 2011; 5 pages.
USPTO Final Rejection for U.S. Appl. No. 11/698,660 dated Apr. 4, 2011; 20 pages.
USPTO Notice of Allowance for U.S. Appl. No. 11/865,672 dated Mar. 2, 2011; 8 pages.
USPTO Notice of Allowance for U.S. Appl. No. 11/857,947 dated Mar. 30, 2011; 8 pages.
USPTO Notice of Allowance for U.S. Appl. No. 12/058,569 dated Apr. 11, 2011; 7 pages.
USPTO Non-Final Rejection for U.S. Appl. No. 12/060,176 dated Apr. 6, 2011; 23 pages.
USPTO Notice of Allowance for U.S. Appl. No. 12/104,672 dated Feb. 14, 2011; 9 pages.
USPTO Advisory Action for U.S. Appl. No. 12/104,678 dated Feb. 16, 2011; 5 pages.

* cited by examiner

GRAPHICAL USER INTERFACE WITH USER-SELECTABLE LIST-BOX

BACKGROUND OF THE INVENTION

1. Field of the Invention

The present invention relates to the field of graphical user interfaces (GUI). Specifically, embodiments relate to a graphical user interface that may be used in one implementation to facilitate the configuration of parameters associated with design elements in a highly complex programmable logical device such as a microcontroller software design tool.

2. Related Art

Application-specific integrated circuits (ASICs), have been supplanted more and more by integrated circuits (ICs) that can be programmed to fulfill multiple functions. There are now many various programmable logic architectures, including, for example, programmable logic devices ("PLDs"), programmable logic arrays ("PLAs"), complex programmable logic devices ("CPLDs"), etc. Although there are differences between these various architectures, each of the architectures typically includes a set of input conductors coupled as inputs to an array of logic gates (e.g., a product term array made up of logical AND gates), the outputs of which, in turn, act as inputs to another portion of the logic device. Complex Programmable Logic Devices ("CPLDs") are large scale PLDs that, like many programmable architectures, are configured to the specific requirements of an application by programming.

Each of these architectures, originally programmed once for a specific function which would be a device's only function for its lifetime, has begun to be implemented in a reprogrammable form. A programmable logic device can now be re-programmed while in operation and can fulfill the functions of many different devices. One of the most complex of the reprogrammable logic devices is the programmable system-on-a-chip, or PSOC, which can be implemented as any of a limitless number of devices, anywhere from simple logic gates to those as complex as microcontrollers.

The complexity of a programmable device, particularly a PSOC, requires complex programming of each of its configurations which can be stored. In many instances, each stored configuration reprogramming can be accomplished "on the fly" by applying the stored configuration to the device.

Initial programming of a highly complex device, though, can be extremely tedious and time consuming. Numerous tools have been developed to aid the programmer in forming each configuration necessary for each device. However, even with current configuration tools, a programmer is required to manually track innumerable lines of programming and device characteristics in order to properly establish a complex device configuration. Most particularly, the configuration of a device's input/output pins that have different characteristics with every different device configuration requires meticulous attention to detail. Moreover, these pin characteristics, crucial for proper device operation, must relate properly to the device configuration and to external circuitry.

Currently, the programming tool sophistication requires a very burdensome level of expertise on the part of the programmer, which can limit the market of users of these complex programmable devices. Various graphical user interfaces are being developed to provide a more user-friendly method of configuring electronic devices.

One tool that exists for aiding the programmer utilizing graphical user interfaces is a dialogue box that may be selected from a menu or other selection icon. The dialogue box then pops up on the screen and typically occupies the center of the screen from which one is working. It contains instructions or a list of items under which are buttons for choosing parameters from the box or for canceling the operation. The dialogue box typically has one or more user interface elements which may or may not contain the complete list of choices needed for the operation being performed, due to limitations in the layout of the dialogue box. The box might require a second level of choices to complete the required operation.

Additionally, a dialogue box obscures a large amount of the display screen that contains the information the user is referencing when selecting items from the dialogue box. The dialogue box then remains on the screen, once an item is chosen, until the user activates a button to perform the operation or to cancel it.

Importantly, the user is not allowed to click on the remaining screen area while the dialogue box is open. Therefore, any other functions that the user may want to select or perform are blocked while the dialogue box is open. Moreover, if the user does not want to make any selections from the dialogue box, the cancel button must be selected by the user before any other function of the software can be performed. Thus, the dialogue box is cumbersome as a tool, and requires excess time for selecting choices and performing operations for which it is designed and it blocks the application of other functions and procedures while it is open.

A need exists, therefore, for a user-friendly method or mechanism for selecting operations via a graphical user interface. Particularly for a graphical user interface used for programming highly complex programmable devices, such as PSOCs, and particularly for configuring I/O pins different for each programmed device configuration. Furthermore, such a method should be much more user-friendly than currently available, enabling a user of normal skills to configure enormously complex programmable devices with multiple configurations.

SUMMARY OF THE INVENTION

Disclosed herein are a user-friendly method and mechanism for selecting operations via a user-selectable list-box in a computer controlled graphical user interface. Particularly for a graphical user interface used for programming highly complex programmable devices, such as PSOCs, and particularly for configuring I/O pins different for each programmed device configuration. Furthermore, this mechanism and method are much more user-friendly than currently available, enabling a user of normal skills to more easily configure enormously complex programmable devices with multiple configurations, using fewer mouse clicks and key strokes.

Embodiments of the present invention relate to a method and mechanism that may be used, in one implementation, for configuring input/output connections in a programmable logical device, which comprise utilizing a user-selectable list-box, presented in a graphical user interface, enabled to aid in configuring the programmable logical device. The pins or other items to be configured can be selected from either a graphical representation or a parameter table. Once a selection is made by activating the cursor on the display screen at the location of the device or item to be configured, a user-selectable list-box is displayed on the screen near the location occupied by the cursor.

Importantly, the user-selectable list-box contains a list of configuration parameters for the device or item selected and the list-box is sized to accommodate the associated list. By being sized to accommodate only necessary information, a minimum amount of the display screen is obscured, thereby allowing the user to still view a large portion of the screen. A user selects a parameter from the list-box by moving the cursor to the parameter of choice. The parameter is then highlighted and when the user double clicks the mouse, presses the return key on the keyboard or otherwise makes a selection, the parameter becomes selected and the device is configured accordingly. The list box then automatically disappears from the screen and the next item can be selected for configuration. Moreover, in accordance with the present invention, if the user does not wish to configure the selected item after the list-box appears, the user needs only to click the mouse button with the cursor outside the list-box and the list-bow will disappear from the screen. Thus, there is no need for "select" and "cancel" buttons or for extra spaces to accommodate longest possible lists, as is the case with dialogue boxes. By automatically removing the list-box upon a user selection (inside or outside the box), the number of user mouse clicks or key strokes required to perform programming tasks is reduced.

More specifically, an embodiment of the present invention comprises a user interface comprising: a plurality of on-screen elements displayed on a display screen of a computer system; and a user selectable list-box displayed adjacent to, and in response to, a selected on-screen element, wherein the user selectable list-box comprises a plurality of items relevant to the selected on-screen element and the user selectable list-box automatically disappears in response to the user making an on-screen selection outside the list-box. Embodiments include the above and wherein the list-box is sized to only accommodate the plurality of items.

Embodiments include the above and wherein the selected on-screen element is selected via a cursor control device or via a keyboard device. Embodiments include the above and the plurality of on-screen elements comprise a graphical representation of a device or comprise information displayed in a tabular format.

Embodiments include the above and wherein a selected item of the plurality of items becomes associated with the selected on-screen element and wherein the user selectable list-box automatically disappears in response to a user selecting the selected item.

The present invention provides these advantages and others not specifically mentioned above but described in the sections to follow. Other features and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
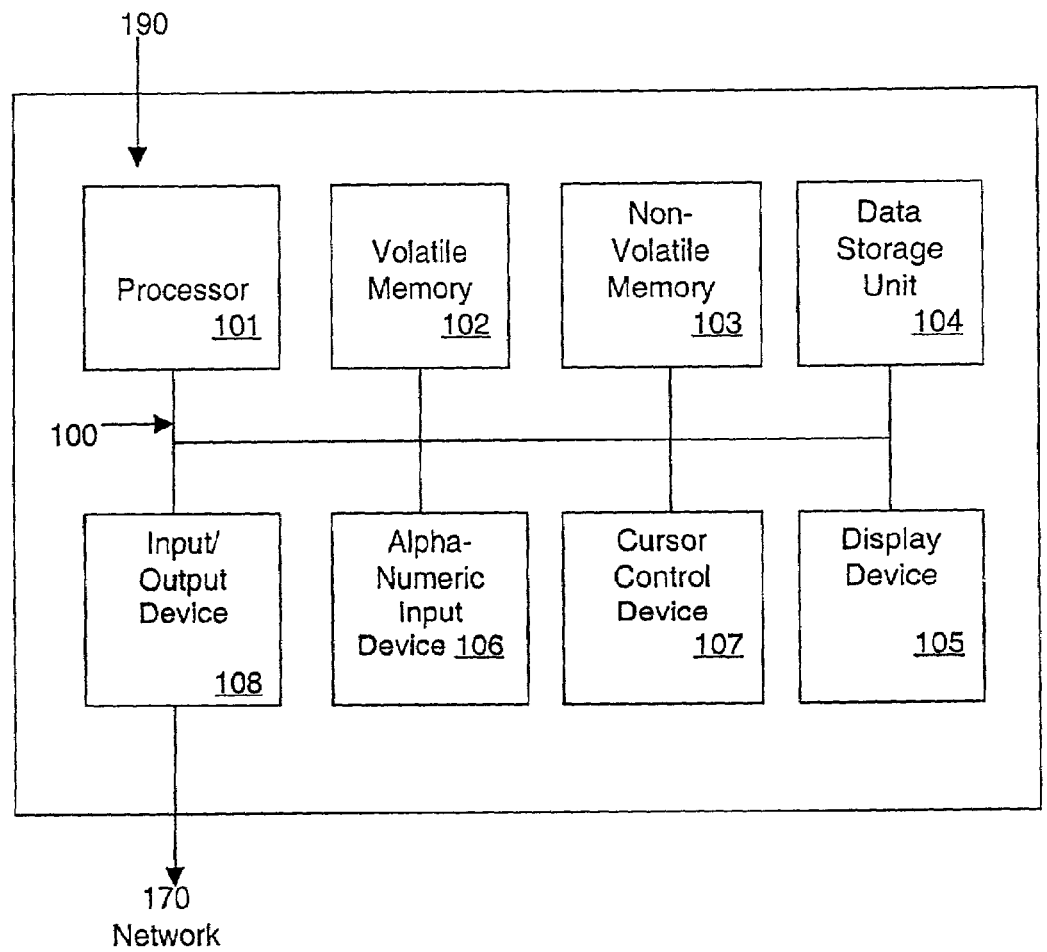
FIG. 1 is a block diagram of an exemplary computer system upon which embodiments of the present invention may be practiced.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussions, it is appreciated that throughout the present invention, discussions utilizing the following terms refer to the actions and processes of a computer system or similar electronic computing device. These devices manipulate and transform data that is represented as physical (electronic) quantities within the computer system's registers and memories or other such information storage, transmission or display devices. The aforementioned terms include, but are not limited to, "selecting" or "initiating" or "clicking" or "double-clicking" or "identifying" or "comparing" or "sorting" or "establishing" or "displaying" or the like.

The configuration of programmable devices has been difficult from the inception of such devices. Multifunction input/output (I/O) pins, especially, have been very difficult to configure in the past. I/O pins are the connection of a device to its environment, the outside electronic world. Typically, I/O pins had multiple registers that needed to be programmed to configure the pin type as well as drive characteristics for each I/O pin. These registers are often tedious to manually program and debug. Laborious and tedious hours or weeks wasted is common in programming and debugging the I/O pin configuration for a single design using a conventional system.

The particular embodiment of the present invention discussed here employs a portion of a graphical user interface (GUI) to facilitate the configuration of I/O pins in a microcontroller software design tool. Note that a microcontroller is one of many different possible configurations for a PSOC. Other configurations of PSOCs and, indeed, other types of programmable devices could be equally benefited by use of the concepts employed in this embodiment. It should also be noted that the GUI employed in one implementation is one developed for configuring PSOCs but other GUIs could also incorporate this embodiment of the present invention.

The GUI referred to in this discussion of this embodiment of the present invention presents a number of window frames that contain various design tools. One of these tools of specific interest to this discussion of this embodiment of the present invention is the I/O pin configuration tool. While actual programming of the device and the I/O pins takes place elsewhere, the GUI provides the user-friendliness and detail management necessary to an efficient programming operation.

Exemplary Computer System

It is envisioned that the embodiment of the present invention discussed herein will be implemented in a general purpose computer similar to the generic computer illustrated in FIG. 1. FIG. 1 illustrates, in block diagram, a configuration typical to a computer system. In general, computer system 190 comprises bus 100 for communicating information, processor 101 coupled with bus 100 for processing information and instructions, random access (volatile) memory (RAM) 102 coupled with bus 100 for storing information and instructions for processor 101, read-only (non-volatile) memory (ROM) 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101.

With reference still to FIG. 1, display device 105 utilized with computer system 190 may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

Computer system 190 also includes an input/output device 108, which is coupled to bus 100 for providing a physical communication link between computer system 190 and a network 170. As such, input/output device 108 enables central processor unit 101 to communicate with other electronic systems coupled to the network 170. It should be appreciated that within the present embodiment, input/output device 108 provides the functionality to transmit and receive information over a wired as well as a wireless communication interface (such as an IEEE 802.11b interface). It should be further appreciated that the present embodiment of input/output device 108 is well suited to be implemented in a wide variety of ways. For example, input/output device 108 could be implemented as a modem or network card.

The embodiment of the present invention discussed herein features the use of a graphical information window in a graphical user interface (GUI) presented in a graphic display. The term "graphical information," as used in this discussion, may include both icons and text. While the particular portion of the graphic display envisioned as the pin configuration window is, in this embodiment, a particular area in the overall graphic display, other embodiments could use a different area of the display.

An important enablement of a GUI is the ability to accept commands related to graphic information in the display. Such commands are generally input by "mouse-click" or by some equivalent keyboard action. A mouse-click refers to any selection method that involves deliberate action on the part of the user specifically related to the position of a cursor in the GUI display, usually involving the user depressing a button on a cursor control mouse. A mouse click can also be implemented by any other means related to cursor control including cursor control by keyboard buttons.

Figure 2:
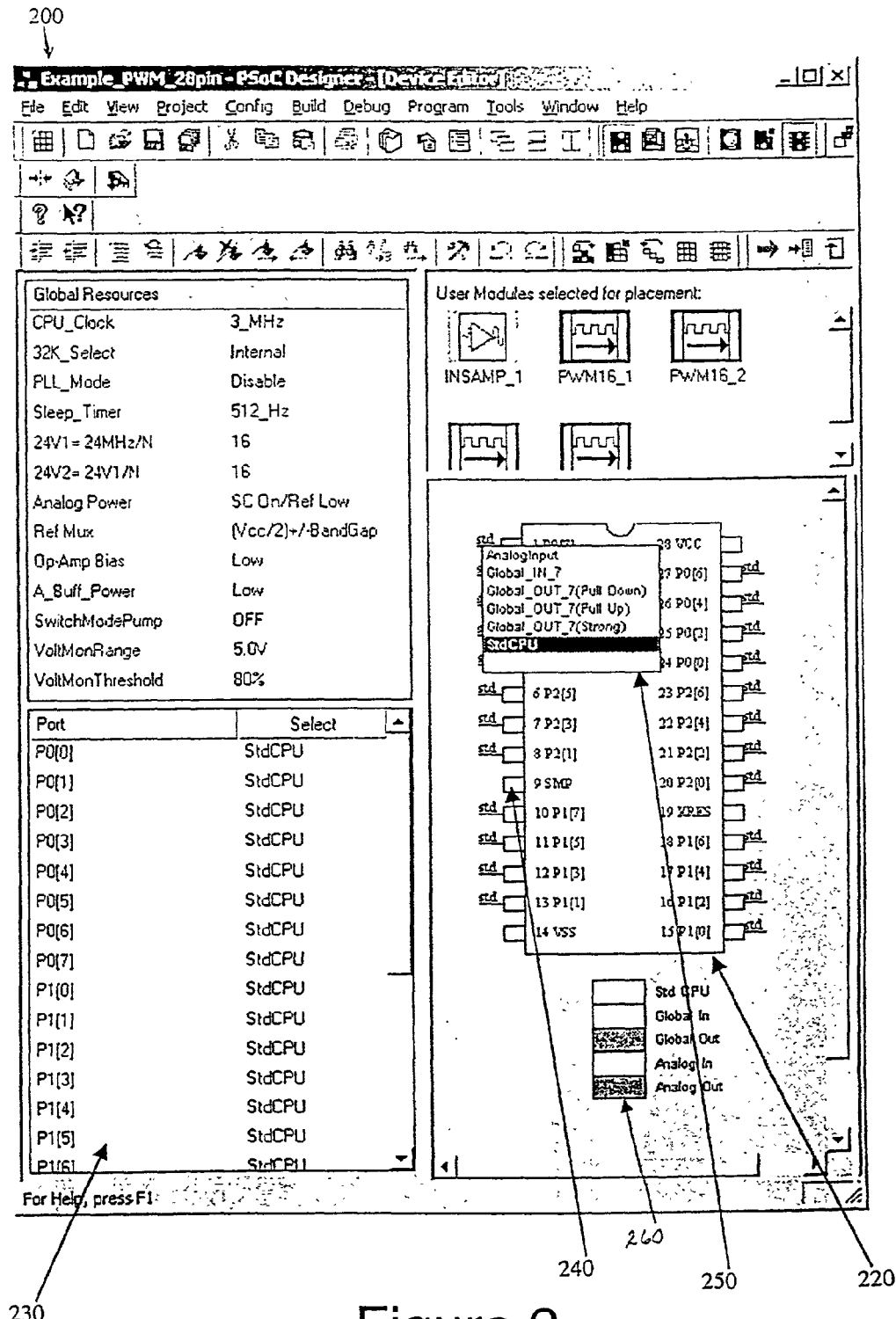
FIG. 2 is an exemplary screen shot of a display window of a graphical user interface illustrating a user-selectable list-box for configuring I/O pins in a programmable logical device, according to an embodiment of the present invention.

One possible implementation of a GUI as referred to in this discussion of one embodiment of the present invention is illustrated as a screen shot of a display window 200 in FIG. 2. There, the GUI is configured for a specific operating system or OS. While such an existing operating system is quite common, this discussion in no way should be taken as to imply that use of the above operating system is integral to the concepts presented herein. Any other operating system capable of presenting a graphical user interface is equally capable of implementing similar embodiments.

The display window 200 shown in FIG. 2 comprises a number of sub-windows or frames within the graphical information area. The portions of the display 200 of FIG. 2 that are specific to this embodiment of the present invention are the pop-up user-selectable list-box 250, Pin Parameter table 230, pin-out graphical representation 220, pin 240, and legend 260. These and similar sub-windows are likely to be associated with this embodiment or others that employ a user-selectable list box to aid the configuration of any programmable logic device.

It must be noted here that the names associated with the indicated tables, windows, icons and displays are given as an indicator of the associated functions. The names are not intended to limit the functionality of any portion of any of the presented illustrations nor are any of the various elements of a GUI expected to be limited to or by any particular naming. Furthermore, the illustrated arrangement of windows in the GUI and of elements in each window are not intended to limit possible display design, arrangements, colors, shapes, patterns or any other graphic constituent to any particular item. It is the concepts presented in this embodiment of the present invention that are intended to be discussed and described here.

Referring still to FIG. 2, according to one embodiment of the present invention, the pop-up user-selectable list-box 250 appears within the display window 200 from which a pin image, such as pin image 240, is selected for configuration. The pin image 240 is selected by placing the cursor at its location within the display window 200 and clicking the mouse button or other keyboard action. Pin image 240 could be selected either from the Pin Parameter Table 230 or from the graphical representation 220, as shown. The pop-up list-box 250 then automatically appears immediately within display window 200 near the selected pin. If the selection were from the Pin Parameter Table 230, the pop-up list-box 250 would appear on or near the listed parameter in Table 230.

According to one embodiment of the present invention, pop-up list-box 250 in FIG. 2 includes configuration parameters that are configurable for the selected pin 240 or other selected component. The pop-up list-box 250 is of a size to accommodate the applicable list of configuration parameters and, thus occupies a minimum amount of space within the display window 200. If the pop-up list-box 250 is displayed but not needed, the user can remove it from the screen by clicking the mouse with the cursor placed anywhere outside of the list-box 250. The list-box 250 then automatically disappears.

Referring still to FIG. 2, to select a parameter from the list within list-box 250, according to one embodiment, the user moves the cursor to the location within list-box 250 of the desired parameter and the parameter is highlighted, e.g., "StdCPU". To apply the parameter to the selected pin 240, the user double-clicks the mouse or presses "enter" on the keyboard. The selected pin 240 is then configured accordingly and the graphical representation of pin 240 may assume a color or other visual attribute defined for the configuration parameter according to legend 260. In this example, the pin selection type is defined. The pin's drive type may similarly be selected using a pop-up list-box mechanism in accordance with the present invention.

Figure 3:
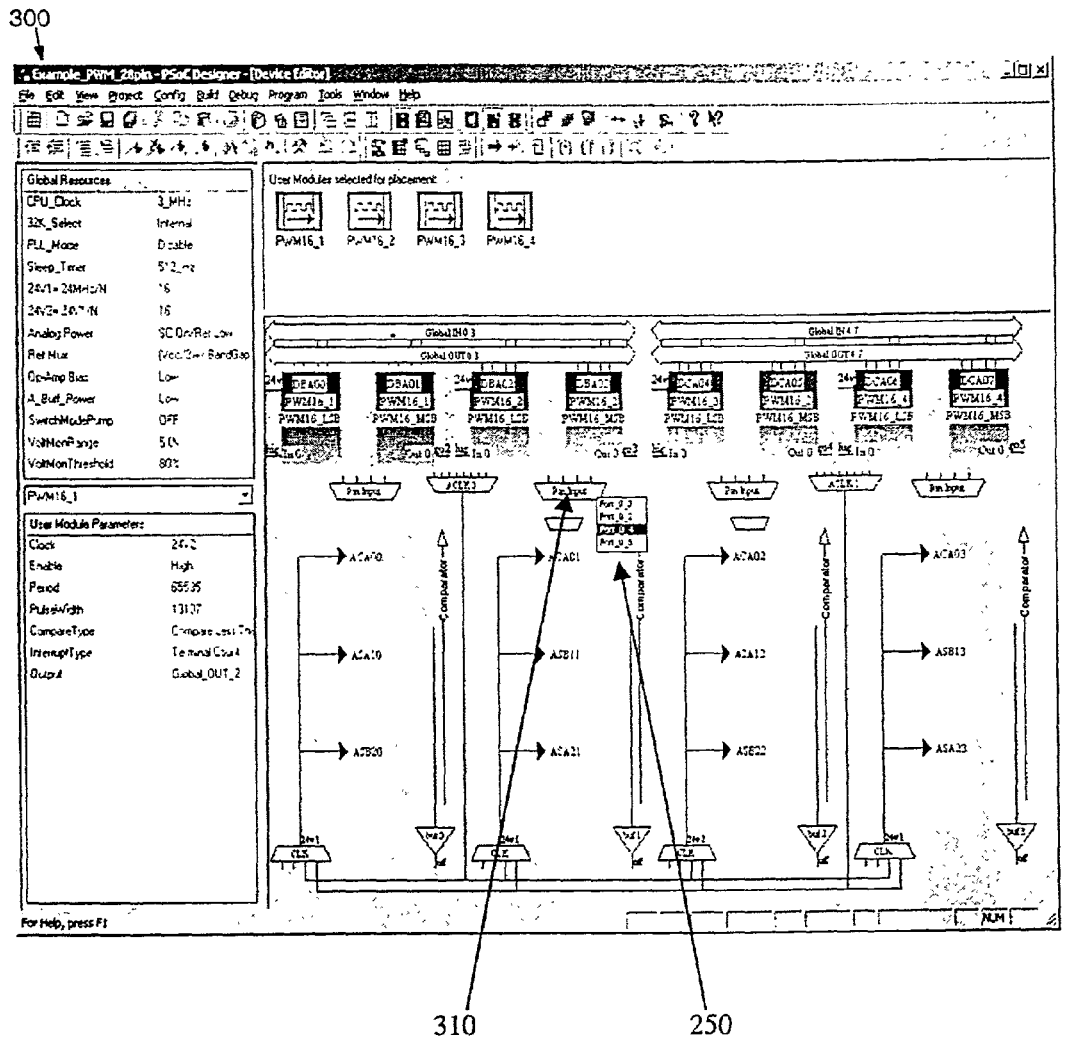
FIG. 3 is an exemplary screen shot of a display window of a graphical user interface illustrating a user-selectable list-box for selecting pin connections for a programmable logical device, according to an embodiment of the present invention.

Referring now to FIG. 3, an exemplary screen shot of a display window 300 for configuring pin connections, according to one embodiment of the present invention, is presented. FIG. 3 illustrates user-selectable list-box 250 for configuring a pin input 310 to be connected to a programmable logical device. User selectable list-box 250 contains a list of ports to which the pin input 310 could be connected. The list-box 250 occupies the room necessary to display the list and is shown in the location where it appears within display 300 when pin input 310 is selected by the user. The highlighted entry, "port_0_4," is selected by double clicking or depresseng the keyboard key.

Figure 4:
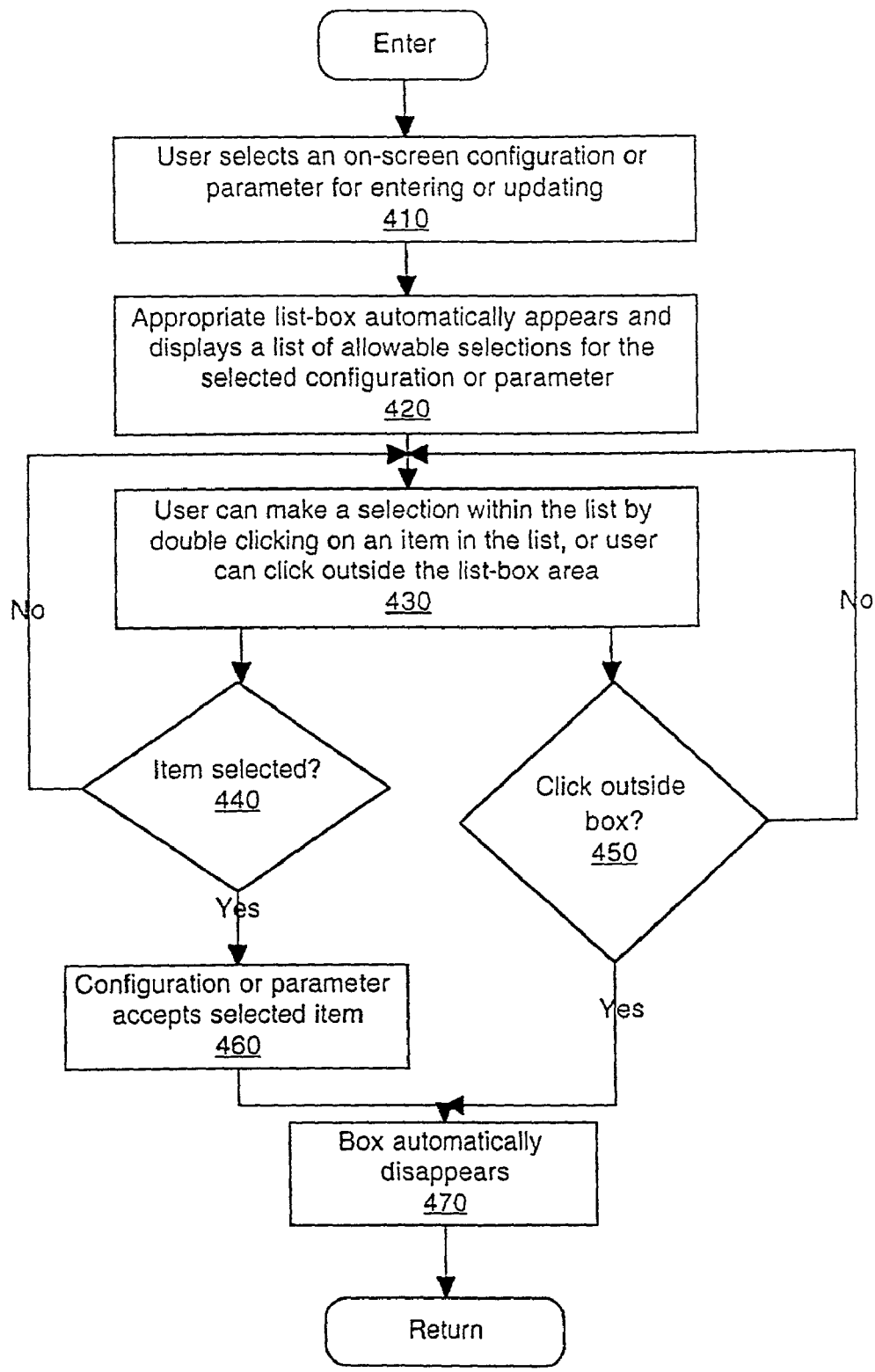
FIG. 4 is a computer implemented flow diagram illustrating steps performed by the graphical user interface list-box in accordance with an embodiment of the present invention.

Referring now to FIG. 4, a computer implemented flow diagram illustrating steps performed by the graphical user interface list-box, in accordance with one embodiment of the present invention, is presented. According to step 410, a user selects an on-screen configuration or a parameter for entering or updating. The selection is made by a click of a mouse button, a keystroke on a keyboard or some other means. Once the selection is made, a list-box automatically appears on the screen near the location of the selected configuration or parameter, as shown by step 420, with an appropriate list of allowable selections for the selected configuration or parameter.

Still referring to FIG. 4, as shown in step 430, the user can select an item from the list by an operation of a mouse or keyboard with the cursor placed on the desirable selection in the list. Once a selection is made, the configuration or parameter may be accepted per step 460 and the list-box automatically disappears from the screen as shown in step 470. Alternatively, the user may place the cursor outside the list-box and click or press a keyboard key, as shown in step 450, in which case the list-box automatically disappears from the screen as in step 470.

Figure 5:
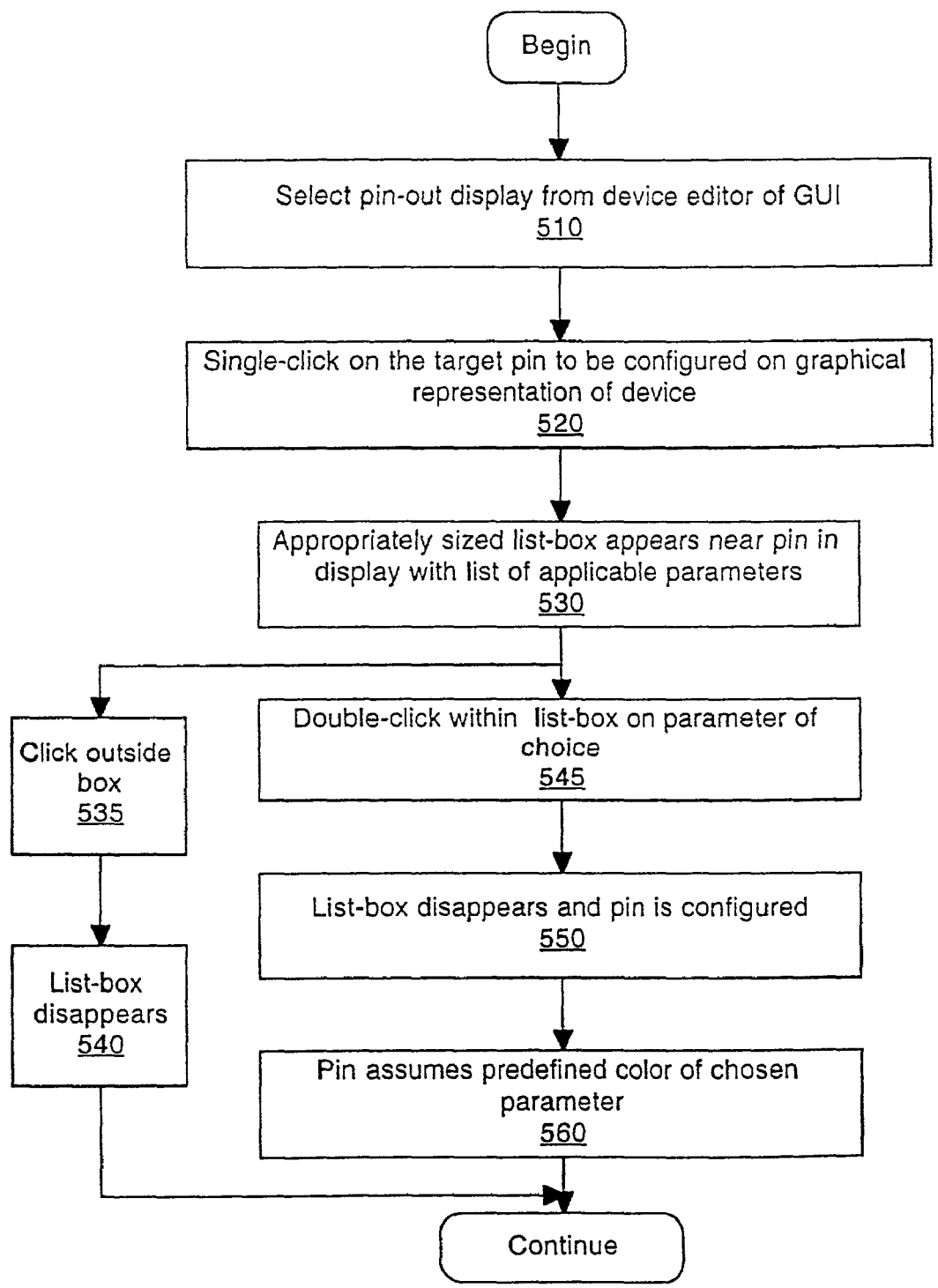
FIG. 5 is a flow diagram of a process for employing a user-selectable list-box for configuring I/O pins in a programmable logical device, according to an embodiment of the present invention.

FIG. 5 is a flow diagram of a computer-implemented process for employing a user-selectable list-box for configuring I/O pins in a programmable logical device, according to one embodiment of the present invention. As shown in step 510, a pin-out view (such as illustrated in FIG. 2) is selected from the device editor of a graphical user interface. A pin image is then selected by placing the cursor on the graphical representation of the pin and single-clicking the mouse button, as shown in step 520. In another embodiment, the pin could be selected by single-clicking the mouse button on the pin in the Pin Parameter Table of the display.

As soon as the pin is selected, according to the present embodiment, a list box appears in the display, as shown in step 530 of FIG. 5. The list box appears (pops up) at a location near the selected pin, thus requiring a minimum amount of mouse movement to access the list-box. The list-box contains a list of applicable configuration parameters for the pin to be configured. The list box is sized according to the area required for the list of applicable parameters.

Still referring to FIG. 5, according to the present embodiment, the user can click outside the list-box, as shown in step 535, and the list-box automatically disappears per step 540. Alternatively, a parameter can now be selected by moving the cursor onto the desired parameter in the list and double clicking the mouse button as illustrated in step 545. Once a parameter is chosen, the list box disappears from the screen per step 550, and the pin is configured according to the selected parameter. As shown in step 560, the graphical representation of the pin may assume a predefined color that is associated with the selected parameter according to a legend that is displayed on the display screen. The pin configuration process can be repeated until all pins are configured according to design.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A graphical user interface for configuring a programmable integrated circuit, the graphical user interface comprising:

a graphical representation of said programmable integrated circuit displayed on a display device coupled to a computer system, wherein said displayed graphical representation physically resembles the shape of the programmable integrated circuit and comprises a plurality of pin images, wherein said plurality of pin images represent actual pins operable to couple said programmable integrated circuit to hardware separate from said programmable integrated circuit; and a user-selectable list box displayed on said display device coupled to said computer system, wherein said user-selectable list box comprises a plurality of selectable items for configuring a portion of said programmable integrated circuit associated with a selected pin image of said plurality of pin images, wherein said user-selectable list box is further for configuring said portion of said programmable integrated circuit in accordance with a selected item of the plurality of selectable items, wherein said user-selectable list box is automatically displayed in response to a selection of said selected pin image, wherein said user-selectable list box is displayed simultaneously with said selected pin image, and wherein said user-selectable list box automatically disappears in response to a user interaction outside said user-selectable list box.

2. A graphical user interface as described in claim 1, wherein said user-selectable list box is sized to only accommodate said plurality of selectable items.

3. A graphical user interface as described in claim 1, wherein said programmable integrated circuit comprises a programmable system on a chip.

4. A graphical user interface as described in claim 1, wherein a color of said selected pin image is changed to an updated color after configuration of said portion of said programmable integrated circuit associated with said selected pin image, wherein said updated color of said selected pin image is associated with said configuration of said portion of said programmable integrated circuit.

5. A graphical user interface as described in claim 1 further comprising labels associated with said plurality of pin images.

6. A graphical user interface as described in claim 1, wherein said user-selectable list box is displayed near said selected pin image.

7. A graphical user interface as described in claim 1, wherein said user-selectable list box automatically disappears in response to a selection of a selected item from said plurality of selectable items displayed within said user-selectable list box.

8. A method of configuring a programmable integrated circuit, said method comprising:
    displaying a graphical representation of said programmable integrated circuit, wherein said displayed graphical representation physically resembles the shape of the programmable integrated circuit and comprises a plurality of pin images, wherein said plurality of pin images represent actual pins operable to couple said programmable integrated circuit to hardware separated from said programmable integrated circuit;
    identifying a selection of a selected pin image from said plurality of pin images;
    in response to said selection of said selected pin image, automatically displaying a user-selectable list box comprising a plurality of selectable items for configuring a portion of said programmable integrated circuit associated with said selected pin image, wherein said user-selectable list box is further for configuring said portion of said programmable integrated circuit in accordance with a selected item of the plurality of selectable items, and wherein the user-selectable list box is displayed simultaneously with said selected pin image; and
    automatically removing said user-selectable list box in response to a user interaction outside said user-selectable list box.

9. The method of claim 8, wherein said identifying said selection of said selected pin image further comprises:
    identifying an overlapping of a displayed cursor and said selected pin image; and
    identifying a user input for selecting said selected pin image.

10. The method of claim 9, wherein said user input is selected from a group consisting of a clicking of a mouse button, a double clicking of said mouse button, and an activation of a button of a keyboard.

11. The method as described in claim 8, wherein said programmable integrated circuit comprises a programmable system on a chip.

12. The method of claim 8 further comprising:
    displaying labels associated with said plurality of pin images.

13. The method of claim 8 further comprising:
    configuring a portion of said programmable integrated circuit associated with said selected pin image, wherein said configuring is based upon said selected item from said user-selectable list box; and
    displaying said selected pin image with an updated color in response to said configuring of said portion of said programmable integrated circuit associated with said selected pin image, wherein said updated color of said selected pin image distinguishes said configuration of said portion from at least one other portion of said programmable integrated circuit.

14. The method of claim 8 further comprising:
    automatically removing said user-selectable list box in response to a selection of a selected item from said plurality of selectable items displayed within said user-selectable list box.

15. A computer-useable storage medium comprising computer-readable program code embodied therein for implementing a method of configuring a programmable integrated circuit, said method comprising:
    displaying a graphical representation of said programmable integrated circuit, wherein said displayed graphical representation physically represents the shape of the programmable integrated circuit and comprises a plurality of pin images, wherein said plurality of pin images represent actual pins operable to couple said programmable integrated circuit to hardware separate from said programmable integrated circuit;
    identifying a selection of a selected pin image from said plurality of pin images;
    in response to said selection of said selected pin image, automatically displaying a user-selectable list box comprising a plurality of selectable items for configuring a portion of said programmable integrated circuit associated with said selected pin image, wherein said user-selectable list box is further for configuring said portion of said programmable integrated circuit in accordance with a selected item of the plurality of selectable items, and wherein the user-selectable list box is displayed simultaneously with said selected pin image; and
    automatically removing said user-selectable list box in response to a user interaction outside said user-selectable list box.

16. The computer-usable medium of claim 15, wherein said identifying said selection of said selected pin image further comprises:
    identifying an overlapping of a displayed cursor and said selected pin image; and
    identifying a user input for selecting said selected pin image.

17. The computer-usable medium of claim 15, wherein said user input is selected from a group consisting of a clicking of a mouse button, a double clicking of said mouse button, and an activation of a button of a keyboard.

18. The computer-usable medium as described in claim 15, wherein said programmable integrated circuit comprises a programmable system on a chip.

19. The computer-usable medium of claim 15, wherein said method further comprises:
    displaying labels associated with said plurality of pin images.

20. The computer-usable medium of claim 15, wherein said method further comprises:
- configuring a portion of said programmable integrated circuit associated with said selected pin image, wherein said configuring is based upon said selected item from said user-selectable list box; and
- displaying said selected pin image with an updated color in response to said configuring of said portion of said programmable integrated circuit associated with said selected pin image, wherein said updated color of said selected pin image distinguishes said configuration of said portion from at least one other portion of said programmable integrated circuit.

21. The computer-usable medium of claim 15, wherein said method further comprises:
- automatically removing said user-selectable list box in response to a selection of a selected item from said plurality of selectable items displayed within said user-selectable list box.

* * * * *